United States Patent
Sanjoh

Patent Number: 6,123,769
Date of Patent: Sep. 26, 2000

[54] CRYSTALLIZATION CONTROL METHOD FOR ORGANIC COMPOUND AND CRYSTALLIZATION CONTROL SOLID-STATE COMPONENT EMPLOYED THEREFOR

[75] Inventor: Akira Sanjoh, Osaka, Japan

[73] Assignee: Sumitomo Metal Industries, Ltd., Osaka, Japan

[21] Appl. No.: 09/396,468

[22] Filed: Sep. 15, 1999

Related U.S. Application Data

[63] Continuation of application No. 08/894,717, filed as application No. PCT/JP96/00462, Feb. 28, 1996.

[30] Foreign Application Priority Data

Mar. 1, 1995 [JP] Japan ........................... 7-68597
Nov. 24, 1995 [JP] Japan ........................... 7-329688

[51] Int. Cl.$^7$ ........................................... E30B 35/00
[52] U.S. Cl. ................ 117/206; 117/900; 117/925; 117/927; 260/DIG. 35
[58] Field of Search ........................ 117/206, 900, 117/925, 927; 422/245.1; 378/73; 260/DIG. 35

[56] References Cited

U.S. PATENT DOCUMENTS

| | | | |
|---|---|---|---|
| 2,483,847 | 10/1949 | Kjeligren | 110/101 |
| 4,131,907 | 12/1978 | Ouyang | 257/337 |
| 4,484,214 | 11/1984 | Misawa et al. | 257/147 |
| 4,990,216 | 2/1991 | Fujita et al. | 117/68 |
| 5,009,861 | 4/1991 | Plaas-Link | 117/223 |
| 5,394,827 | 3/1995 | Cheng | 117/206 |
| 5,542,372 | 8/1996 | Sun et al. | 117/68 |
| 5,597,457 | 1/1997 | Craig et al. | 204/165 |
| 5,738,720 | 4/1998 | Shimada et al. | 117/94 |
| 5,889,315 | 3/1999 | Farrenkopf et al. | 257/552 |

FOREIGN PATENT DOCUMENTS

| | | |
|---|---|---|
| 0 274 824 | 7/1988 | European Pat. Off. |
| 0 402 917 | 12/1990 | European Pat. Off. |
| 63-148984 | 6/1988 | Japan |
| 63-227600 | 9/1988 | Japan |
| 63-282186 | 11/1988 | Japan |
| 1-111798 | 4/1989 | Japan |
| 1-139102 | 5/1989 | Japan |
| 1-172298 | 7/1989 | Japan |
| 2-18373 | 1/1990 | Japan |
| 2-44089 | 2/1990 | Japan |
| 2-115292 | 4/1990 | Japan |
| 2-149496 | 6/1990 | Japan |
| 3-50178 | 3/1991 | Japan |
| 4-182398 | 6/1992 | Japan |
| 4-216441 | 8/1992 | Japan |
| 4-224197 | 8/1992 | Japan |
| 4-367599 | 12/1992 | Japan |
| 5-60665 | 3/1993 | Japan |
| 5-319999 | 12/1993 | Japan |

(List continued on next page.)

OTHER PUBLICATIONS

E.I. Givargizov et al., "Artificial epitaxy (graphoepitaxy) or proteins", *Journal of Crystal Growth*, vol. 112, No. 4, Jul. 1991, pp. 758–771

M. Thakur et al., "A Method for the Preparation of Thin Single Crystal Films of Organic Superconductors", *Journal of Crystal Growth*, vol. 106, Dec. 1990, pp. 724–727.

*Primary Examiner*—Benjamin L. Utech
*Assistant Examiner*—Donald L. Champagne
*Attorney, Agent, or Firm*—Burns, Doane, Swecker & Mathis, LLP

[57] ABSTRACT

A method which can control crystallization of a biopolymer such as protein is provided. A silicon crystal (15) whose valence electrons are controlled to be capable of controlling the concentration of holes or electrons of the surface part in response to the environment of a buffer solution (14) containing the biopolymer such as protein is brought into contact with the solution (14), for getting a crystal of the biopolymer deposited on the surface of the silicon crystal (15). Crystallization is controlled by an electrical state which is generated by the controlled valence electrons on the surface of the silicon crystal (15).

5 Claims, 26 Drawing Sheets

FOREIGN PATENT DOCUMENTS

| | | |
|---|---|---|
| 6-116098 | 4/1994 | Japan . |
| 6-172381 | 6/1994 | Japan . |
| 6-508813 | 10/1994 | Japan . |
| 6-321700 | 11/1994 | Japan . |
| 7-33796 | 2/1995 | Japan . |
| 7-35687 | 2/1995 | Japan . |
| 8-34699 | 2/1996 | Japan . |
| 410007498A | 1/1998 | Japan . |
| WO 92/14869 | 9/1992 | WIPO . |

SURFACE
CHARGE
DENSITY
DISTRIBUTION

FIG. 18
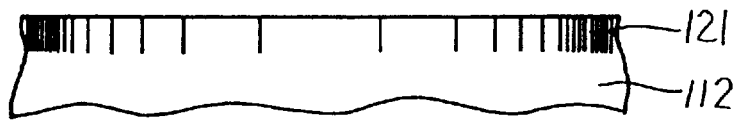
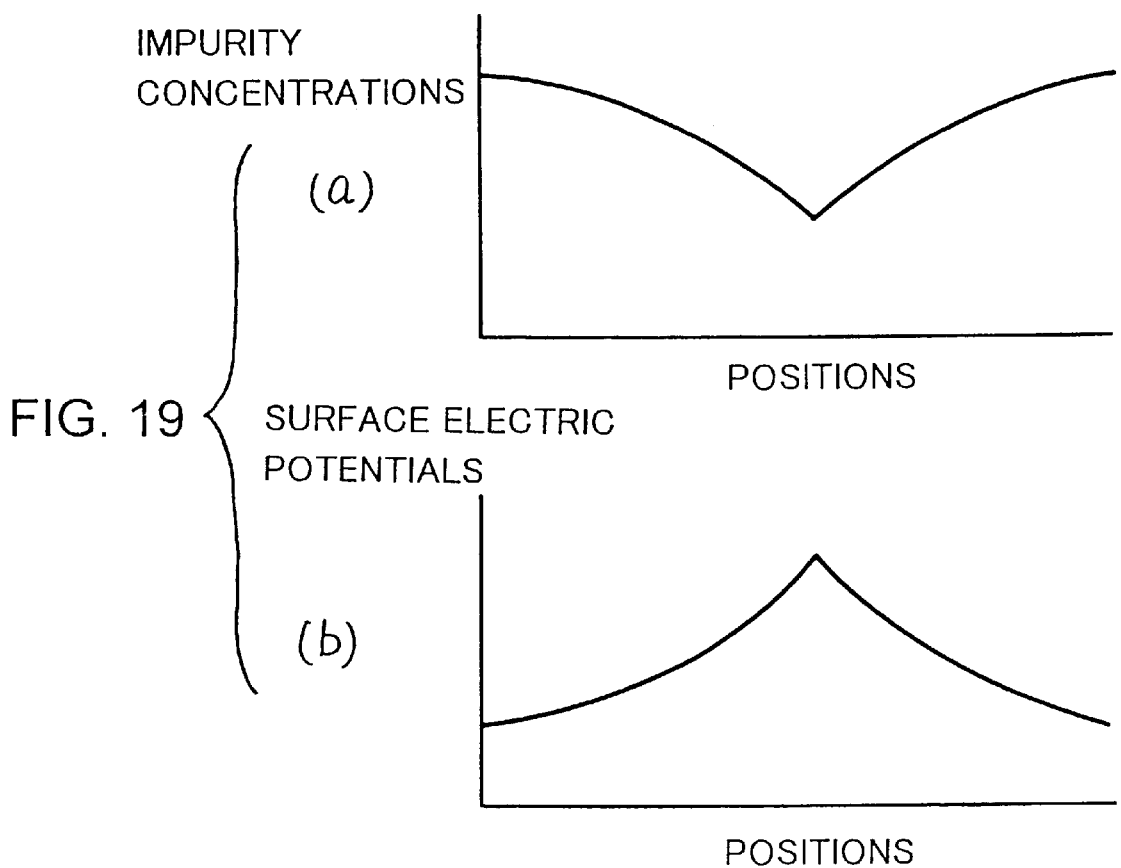
FIG. 19

IMPURITY CONCENTRATIONS
(a)
POSITIONS

SURFACE ELECTRIC POTENTIALS
(b)
POSITIONS

CRYSTALLIZATION CONTROL METHOD FOR ORGANIC COMPOUND AND CRYSTALLIZATION CONTROL SOLID-STATE COMPONENT EMPLOYED THEREFOR

This application is a continuation of application Ser. No. 08/894,717, filed as PCT/JP96/00462 Feb. 28, 1996.

TECHNICAL FIELD

The present invention relates to a method for positively controlling crystallization of organic compounds, and more particularly, it relates to a method for controlling crystallization of various biopolymers such as protein by employing a semiconductor substrate or the like whose valence electrons are controlled.

BACKGROUND TECHNIQUE

For understanding specific properties and functions in various types of biopolymers such as protein and complexes thereof, detailed steric structures thereof are indispensable information. From the basic biochemical viewpoint, for example, information on the three-dimensional structure of protein or the like serves as the basis for understanding the mechanism of function appearance in a biochemical system by an enzyme or hormone. Particularly in the fields of pharmaceutical science, genetic engineering and chemical engineering among industrial circles, the three-dimensional structure provides information indispensable for rational molecular design for facilitating drug design, protein engineering, biochemical synthesis and the like.

As a method of obtaining three-dimensional steric structural information of such biopolymers at atomic levels, X-ray crystal structural analysis is the most cogent and high-accuracy means at present. Analytic speeds are remarkably improving by rapid improvement of arithmetic processing speeds of computers in addition to reduction of measuring times and improvement of measuring accuracy due to recent hardware improvement of X-ray light sources-analyzers, and the three-dimensional structures are conceivably going to be clarified with the main stream of the X-ray crystallographic analysis also from now on.

In order to decide the three-dimensional structure of a biopolymer by X-ray crystal structural analysis, on the other hand, it is indispensable to crystallize the target substance after extraction-purification. At present, however, there is neither technique nor apparatus which can necessarily crystallize any substance when applied, and hence crystallization is progressed while repeating trial and error drawing on intuition and experience under the present circumstances. A search by an enormous number of experimental conditions is necessary for obtaining a crystal of a biopolymer, and crystal growth forms the main bottleneck in the field of the X-ray crystallographic analysis.

Crystallization of a biopolymer such as protein is basically adapted to perform a treatment of eliminating a solvent from water or an anhydrous solution containing the polymer thereby attaining a supersaturated state and growing a crystal, similarly to the case of a general low molecular weight compound such as inorganic salt. As typical methods therefor, there are (1) a batch method, (2) dialysis and (3) a gas-liquid correlation diffusion method, which are chosen in response to the type, the quantity, the properties etc. of a sample.

The batch method is a method of directly adding a precipitant eliminating hydration water to a solution containing a biopolymer for reducing the solubility of the biopolymer and converting the same to a solid phase. In this method, solid ammonium sulfate, for example, is frequently used. This method has such disadvantages that the same requires a large quantity of solution sample, fine adjustment of a salt concentration and pH is difficult, skill is required for the operation, and reproducibility is low. As shown in FIG. 45, for example, the dialysis, which is overcoming the disadvantages of the batch method, is a method of sealing a solution 52 containing a biopolymer in the interior of a dialytic tube 51 for continuously changing the pH etc. of a dialytic tube outer liquid 53 (e.g., a buffer solution) and making crystallization. According to this method, the salt concentrations of the inner and outer liquids and the pH difference are adjustable at arbitrary speeds, and hence the conditions for crystallization are easy to find out. As shown in FIG. 46, for example, the gas-liquid correlation diffusion method is a technique of placing a droplet 62 of a sample solution on a sample holder 61 such as a cover glass and placing this droplet and a precipitant solution 64 in a sealed container 63, thereby slowly setting up an equilibrium by evaporation of volatile components therebetween.

However, there are various problems in crystallization of a biopolymer such as protein, as described above in the present circumstances. First, the crystallinity is not excellent. A biopolymer contains a large quantity of solvent (mainly water) ($\geq 50$ volume %), dissimilarly to crystals of other substances. This solvent is disorderly and readily movable in the intermolecular clearances of the crystal. Although the molecules are gigantic, further, there is substantially no wide-ranging intermolecular packing contact in the crystal, and only slight molecule-to-molecule contact or contact by hydrogen bond through water molecules is present. The crystallinity is not excellent due to such factors. Second, it is extremely sensitive to crystal conditions. While the biopolymer is stabilized in the solvent by interaction between individual molecular surfaces, charge distributions on the molecular surfaces, particularly conformation of amino acids in the vicinity of the molecular surfaces etc., extremely vary with the environment, i.e., the pH, the ionic strength and the temperature of the solution, the type and the dielectric constant of the buffer solution and the like. Therefore, the crystallization process becomes a multi-parameter process in which complicated various conditions are entangled with each other, and it has been impossible to establish a unific technique which is applicable to any substance. As to protein, crystallization of hydrophobic membrane protein is extremely difficult at present although it is biochemically extremely important as compared with water-soluble protein, and only two examples have heretofore performed crystallization and further succeeded in analysis of high resolution.

As described above, crystallization of biopolymers such as protein and complexes thereof forms the most significant bottleneck for the X-ray crystal structural analysis since the same has heretofore been progressed while repeating trial and error, although this is an important process in science and industry. Therefore, it is necessary to hereafter understand the basic principle of crystallization and develop a crystallization technique which is applicable to any molecule.

DISCLOSURE OF THE INVENTION

An object of the present invention is to technically overcome the disadvantages of the conventional crystallization process which has been progressed while repeating trial and error with no existence of a technique applicable to any substance due to the provision of various properties as described above.

In more concrete terms, the present invention aims at providing a method of controlling nucleation in an initial process of crystallization of various biopolymers and biological constructions mainly formed by biopolymers thereby suppressing or controlling mass formation of crystallites, and aims at providing a technique of growing the same up to large-sized crystals which can enable X-ray structural analysis.

According to the present invention, a method for controlling crystallization of an organic compound contained in a solvent comprises a step of providing a solid-state component whose valence electrons are so controlled that the concentration of holes or electrons on the surface part can be controlled in response to the environment of the solvent containing the organic compound, and a step of bringing the solid-state component into contact with the solvent containing the organic compound for depositing a crystal of the organic compound on the surface of the solid-state component, wherein crystallization of the organic compound is controlled by an electrical state brought on the solid surface by the controlled valence electrons.

The present invention can be employed for crystallizing various organic compounds such as aliphatic compounds, aromatic compounds and the like. Further, the present invention is preferably applied for crystallizing compounds such as amino acids, proteins, lipids, sugars and nucleic acids forming an organism, and complexes and derivatives thereof, in particular, among organic compounds. The present invention is preferably applied for crystallization of biopolymers.

According to the present invention, an organic compound is deposited on a surface of a solid-state component allowing valence electron control. A semiconductor substrate can be employed as such a solid-state component. Semiconductors include those of simple substances such as Ge, Si and the like, and those of compounds such as Ga—As, CdS and the like. In the present invention, further, other materials can also be employed so far as valence electron control is possible, and ferroelectrics such as barium titanate, strontium titanate and the like can also be employed, for example.

Further, the semiconductor substrate which is the solid-state component can have a p-n junction part. Namely, a semiconductor device (element) having p-n junction can be employed as the solid-state component.

On the other hand, the solid-state component can have a groove, and can deposit the organic compound in the groove. When a semiconductor substrate having p-n junction is employed as the solid-state component, the p-n junction part is preferably exposed in the groove.

In the present invention, the solvent is not particularly restricted so far as the same is a liquid for holding the organic compound to be crystallized. While water or an aqueous solution such as a buffer salt solution is employed in general, still another organic solvent or the like can also be employed. In the present invention, an electrolyte solution is preferably employed as the solvent.

In the method of the present invention, a space-charge layer may be formed on the employed solid-state component, so that crystallization of the organic compound can be controlled by a surface potential based on the space-charge layer. Further, the surface potential may be made to vary with the portion on the surface of the solid-state component, whereby desired crystallization can be performed in a specific region of the solid-state component surface.

The surface electric potential of the solid-state component or the electrical state of the surface can be controlled by the concentration of an impurity doped in the solid-state component. The concentration of the impurity contained in the solid-state component is different between the surface part and the interior of the solid-state component, in general.

In the surface part of the solid-state component, the concentration of the impurity can be continuously or stepwisely reduced or increased from a first prescribed region to a second prescribed region. In the surface part of the solid-state component, further, the impurity concentration can also be set to be maximal or maximum or minimal or minimum at a specific region.

In the method of the present invention, the surface part of the solid-state component can at least have a first region and a second region which are different in impurity concentration from each other. Crystallization can be accelerated in either one of the first region and the second region, and the crystallization can be suppressed in the remaining region. Such first region and second region can be two-dimensionally arranged.

According to the present invention, further, a crystallization control solid-state component employed for the aforementioned method can be provided. Such a component comprises a semiconductor substrate in which an impurity is added to at least a surface part for bringing a prescribed surface electric potential, in order to control crystallization of the organic compound contained in the solvent.

BRIEF DESCRIPTION OF THE DRAWINGS

FIG. 18 is a schematic sectional view showing a concrete example of a solid-state component provided with a region having the lowest impurity concentration in its central portion.

FIG. 19 shows diagrams illustrating a distribution of impurity concentrations and change of a surface electric potential in the solid-state component shown in FIG. 18.

BEST MODE FOR CARRYING OUT THE INVENTION

A biopolymeric substance such as protein has extremely large specific gravity dissimilarly to other low-molecular compounds. In the solution, intermolecular recognition is made almost by a geometrically specific structure and electrostatic interaction (electrostatic repulsive force-attraction and van der Waals force). In the intermolecular interaction based on electrostatic energy, it is predicted that the slight difference between spatial charge distributions on individual molecular outermost surfaces exerts decisive influence on the degree of the intermolecular recognition and easiness of formation of a molecule aggregate. Therefore, it is conceivable that, when a biopolymer having large specific gravity sediments and aggregates in the solution, the density of the ambient solution locally changes and the low-density solution rises to cause convection, and hence homogeneous crystal growth is hindered. It is further conceivable that, even if a crystal nucleus is formed, it comes to that respective molecules aggregating around the nucleus are loosely bonded with each other when molecular structures and charge distributions on the nuclear molecular surfaces are getting unidentical due to influence by denaturation of the molecules (a phenomenon that steric structures enter deformed states), and hence the crystallinity lowers.

According to the present invention, a solid-state component whose valence electrons are controlled is brought into contact with a liquid containing an organic compound to be crystallized, in order to stably form a crystal nucleus. The solid-state component can control the concentrations of electrons and holes from the surface in contact with the liquid toward the interior, or in a section of the solid-state component, due to the valence electron control, thereby controlling the electrical properties of the solid-state component surface. With respect to the polarity and charge quantities of the effective surface charges provided in the molecules to be crystallized, for example, it is possible to provide a solid-state component having a controlled charge quantity which is equivalent to the effective charge quantity per at least one molecule or in excess thereof. Further, it is possible to provide a solid-state component surface having at least one or more electric properties selected from an ohmic property, a non-ohmic property and such a property that the ohmic property and the non-ohmic property are spatially intermixed with each other, with respect to the molecules to be crystallized, by valence electron control in the solid-state component. Such valence electron control may be gained by introducing a dopant into a semiconductor crystal in a prescribed concentration to a prescribed region, for example. According to the present invention, it is possible to fix a crystal nucleus to the surface of such a solid-state component by electrical action, for controlling growth of the crystal on the surface of the solid-state component.

Figure 1:
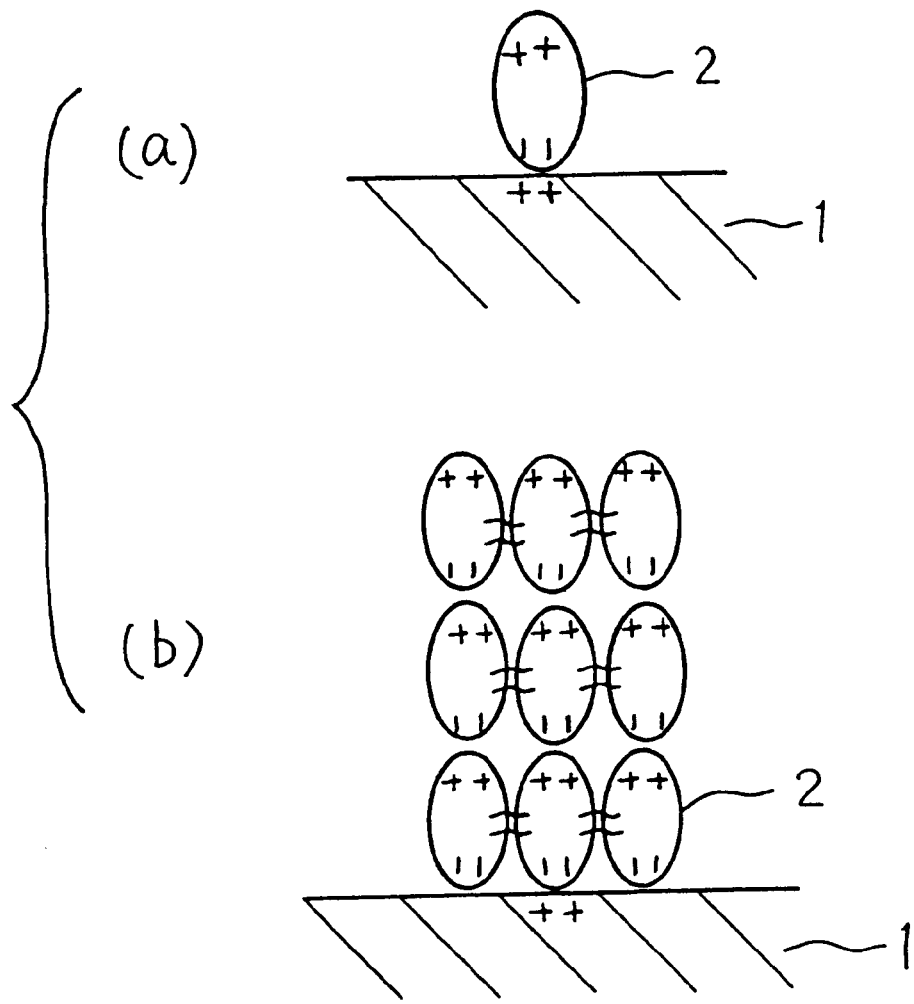
FIG. 1 shows typical diagrams illustrating such a state that a crystal nucleus is fixed to the surface of the solid-state component and crystal growth progresses.

For example, FIG. 1 typically shows such a state that a crystal nucleus is fixed on the solid-state component surface and a crystal grows in accordance with the present invention. According to the present invention, a crystal nucleus 2 is fixed by electrostatic action to the surface of a solid-state component 1 which is brought into a prescribed electrical state, due to valence electron control, as shown in FIG. 1(a). As shown in FIG. 1(b), an organic compound such as protein aggregates on the solid-state component surface by electrostatic interaction, formation of crystal nuclei is accelerated, and growth of a crystal is brought. Therefore, control of crystallization may be gained by controlling the electrical properties of the solid-state component surface. For example, the type, the quantity and arrangement density etc. of the crystal nucleus fixed to the solid-state component surface can be adjusted by valence electron control, whereby control of crystallization is enabled. The formed crystal nuclei are fixed to the solid-state component surface, whereby it is also expected that small fluctuation of the nuclei resulting from convection or the like in the solution is suppressed, the molecules regularly aggregate in accordance with the formation of the nuclei, and the crystallinity improves.

Aggregateness of charged substances or molecules in an electrolytic solution generally depends on the sum of electric double layer repulsive force and van der Waals force therebetween and hence it is extremely important to control the concentration of salt added into the electrolytic solution for adjusting a surface potential in case of aggregating the substances or the molecules with each other, while the present invention also has such an advantage that adjustment of the salt concentration is made easy or unnecessary since the electrostatic property of the solid-state component surface can be previously adjusted by valence electron control.

While the solid applied to such an object may be any substance so far as the same is a substance having the aforementioned electrostatic property and being capable of controlling a charge amount and polarity and is a substance chemically stable in a solution, a semiconductor crystal silicon can be one of preferable materials. Now, the mechanism of crystallization reasoned out as to the case of employing a silicon crystal is hereafter described. However, the mechanism described below can be also applied to another solid-state component employed in accordance with the present invention.

For example, consider an operation of depositing a crystal from an electrolytic aqueous solution containing a biopolymer having negative effective charges. An n-type or p-type silicon crystal having valence electrons controlled can be employed as the solid-state component. It is conceivable that a Schottkey barrier is formed with respect to an n-type silicon surface while ohmic contact is attained with respect to a p-type silicon surface when the n-type or p-type silicon crystal is dipped in the electrolytic aqueous solution. On the surface of the n-type silicon, a surface electric potential depending on the electrolyte concentration of the aqueous solution is generated, while a space-charge layer region is formed in the interior. The space-charge amount also depends on the dopant concentration of the n-type silicon. Therefore, it is reasoned out that the biopolymers having negative charges in the electrolytic aqueous solution continue aggregation on the silicon surface until the same at least compensate for the positive space charges provided in the n-type silicon. On the p-type silicon surface, on the other hand, it is reasoned out that the biopolymers regularly continue aggregation on the silicon surface since holes are regularly supplied from the silicon side (ohmic property) with respect to the molecules having the negative charges. It is conceivable with that aggregation and crystallization of the biopolymers limitedly occur with respect to the silicon surface which is formed with the space-charge layer region, while aggregation of the biopolymers unlimitedly progresses with respect to the silicon surface where ohmic contact is formed. While the crystallization of molecules having negative effective charges have been described above, it is conceivable that in the case of crystallization of molecules having positive effective charges, crystallization progresses in a mechanism reverse to the above on the n-type silicon and p-type silicon. Namely, it is conceivable that aggregation of molecules are easy to progress on the n-type silicon surface since large amounts of electrons are supplied from the silicon side (ohmic property) with respect to the molecules having positive effective charges. On the p-type silicon surface, on the other hand, it is conceivable that the molecules are aggregated on the silicon surface until the same compensate for the formed negative space charges. Therefore, it is conceivable that crystallization of the molecules is limited on the p-type silicon surface.

n-type and p-type silicon crystals employed for the present invention may be those having equivalent properties to a silicon wafer employed in a general LSI process. The specific resistance of the silicon crystal may be within the range of 0.001 to 1000 $\Omega$cm, and that within the range of 0.001 to 100 $\Omega$cm is more desirable. As to the surface of the silicon crystal, a mirror-polished one is preferable for performing the control of the crystal nucleus.

Further, it is also possible to employ a silicon crystal whose valence electrons are controlled to become an n type and a p type from the surface toward the interior (as a layered structure of a p type and an n type). In this case, the silicon surface is forward-biased and holes are regularly supplied from the silicon side to the surface with respect to the molecules having negative effective charges in an electrolytic aqueous solution. Thus, it conceivably comes to that the molecules having negative effective charges electrostatically aggregate on the silicon surface. On the other hand, it is also possible to employ a silicon crystal which has valence electrons controlled to become a p type and an n type from the surface toward the interior (as a layered structure of an n type and a p type). In this case, the silicon surface is reverse-biased with respect to an electrolytic solution containing the molecules having negative effective charges, whereby a depletion layer is formed in a p-n junction part, and hence space charges are generated. These space charges depend on an impurity concentration necessary for performing valence electron control and its gradient, and further on a surface electric potential. Thus, it is conceivable that the molecules having negative effective charges aggregate on the surface until the same compensate with the space-charge amount of the silicon, and it is reasoned out that the crystal growth goes different from that on the silicon which has valence electrons controlled to become an n type and a p type from the surface toward the interior. Namely, it is conceivable that while aggregation of the molecules unlimitedly progresses with respect to the forward-biased silicon surface, aggregation and crystallization of the molecules are limited to progress until the charges are compensated with respect to the reverse-biased silicon in which the space-charge layer region is formed.

The n-type and p-type silicon crystals employed for such a technique may be those having equivalent properties to a silicon wafer employed in a general LSI process. The specific resistance of the silicon crystal may be within the range of about 0.001 to 1000 $\Omega$cm, and that in the range of 0.001 to 100 $\Omega$cm is more desirable. Further, it is preferable that the surface of the crystal is mirror-polished, for suppressing formation of excessive crystal nuclei. In case of forming a layer containing an impurity on the silicon substrate surface in the present invention, the thickness of the layer is desirably 0.1 to 200 $\mu$m, and more desirably in the range of 1 to 50 $\mu$m. The other range is not preferred since the layer is uneasy to prepare or becomes ineffective.

While various ones are conceivable as preparation methods for silicons valence-electron-controlled in an n type and a p type employed in the present invention and any method is employable, an ion implantation can be employed as the method which is simplest and capable of exactly controlling an impurity concentration. In case of this method, valence electron control of the p type and n type can be readily performed by injecting ions of elements belonging to the group III and the group V of the periodic table into silicon and annealing the same respectively. B, Al, Ga, In, Ti and the like may be the group III elements for making it the p type, and B is particularly general. N, P, As, Sb, Bi and the like may be the group V elements for making it the n type, and P, As and Sb are particularly general.

In the case of forming p-n junction in the present invention, its thickness is preferably as follows, for example: In case of forming a p-type silicon layer on an n-type substrate, it is advisable to form, on the n-type silicon surface, the p-type silicon layer in the range of preferably 1 to 200 μm, more preferably 3 to 50 μm. The other range is not preferable since the layer is uneasy to prepare or the effect disappears. This also applies to the case of forming an n-type silicon on a p-type substrate, and it is desirable to form the n-type layer of a similar thickness on the surface of the p-type silicon.

In the present invention, a concave groove part may be formed by isotopic or anisotropic etching from the surface of the valence-electron-controlling solid-state component toward its interior. The solid-state component may be made to contain at least one or more impurity elements for valence electron control in it. For example, the steps of preparing a silicon crystal as the solid, forming n-type and p-type impurity layers from its surface toward the interior (identical to forming an n-type doping layer on p-type silicon), and working these by etching can form a groove which sufficiently reaches the p-type layer. In this case, a region of a space-charge layer based on the p-n junction is exposed on the groove section. When this solid is dipped in an electrolytic aqueous solution containing a biopolymer, aggregates of the biopolymer having large specific gravity may be assembled on the outermost surface of the solid and the groove part to form crystal nuclei. Regions of the space-charge layer are present on both side walls of the groove part, whereby electrostatic attraction may act on movable electrolytic ions and hydrate water in the electrolytic aqueous solution and convection in the groove part may be suppressed. It is conceived that fluctuation of a convection speed in a solution modulates the supply of molecules to crystal nuclei under the rate controlling by diffusion and hence exerts bad influence on the crystallinity. It is expected that the crystallinity of the molecules regularly assembled on the surface may be improved when the convection in the solution is suppressed by thus forming the groove part.

In the present invention, the groove part on silicon or the like can be formed by isotropic or anisotropic etching. In either method, it is advisable that the groove is formed with a depth exceeding the thickness of the impurity layer formed in the surface layer, i.e., in the range of preferably at least 1 to 200 μm, more preferably at least 3 to 50 μm. In the other range, preparation often generally becomes uneasy. The width of the groove on the solid component surface, which relates to the size of the crystal to be formed, may be about 1 to 2 mm at the maximum in general, or may be not more than 1 mm if circumstances require. A wet process employing a general chemical agent of acid or alkali, and a dry etching method employing reaction gas can be applied as the isotropic or anisotropic etching, and these can be properly chosen depending on the shape, the width and the depth of the groove part.

While the case employing semiconductor crystal silicon which is easy to valence electron control has been described above, another material having a similar function can be properly employed for attaining the object. Further, any substance can be employed even if the same is not a semiconductor crystal so far as the same is stable in the solution, and inorganic compounds, organic compounds and organic polymers controlled in charge distribution, for example, can be candidates for the solid-state component for crystallization.

It is conceivable that the technique of the present invention is applicable to preparation of a molecular device or an immunoreaction imitative device applying the function of biopolymers, for example. When the solid surface of silicon is finely worked and various biopolymers are fixed to the surface in accordance with the present invention, for example, it is expected possible to provide an apparatus which can detect information from the biopolymers serving as receptors by a semiconductor device and electrically treat the information. When silicon is employed, there are such advantages that the technique of integrated circuits can be applied as such and sensing of various reactions and control of signals can be implemented in a single chip. In provision of such a device, it is expected that the fixation of a crystal nucleus to the solid-state component surface and the process of crystal growth according to the present invention are useful.

Biopolymers utilize electrostatic interaction and stereospecificity in intermolecular recognition. Electrostatic fixation of molecules to the solid-state component surface according to the present invention can correspond to the aforementioned electrostatic interaction. When the groove part of the solid-state component is made to have action similar to the stereospecificy in the present invention, fixation of specific molecules on the solid-state component and crystal growth thereof will become possible, and it is expected that an electronic device employing a biopolymer may be produced on the basis of this technique.

Figure 2:
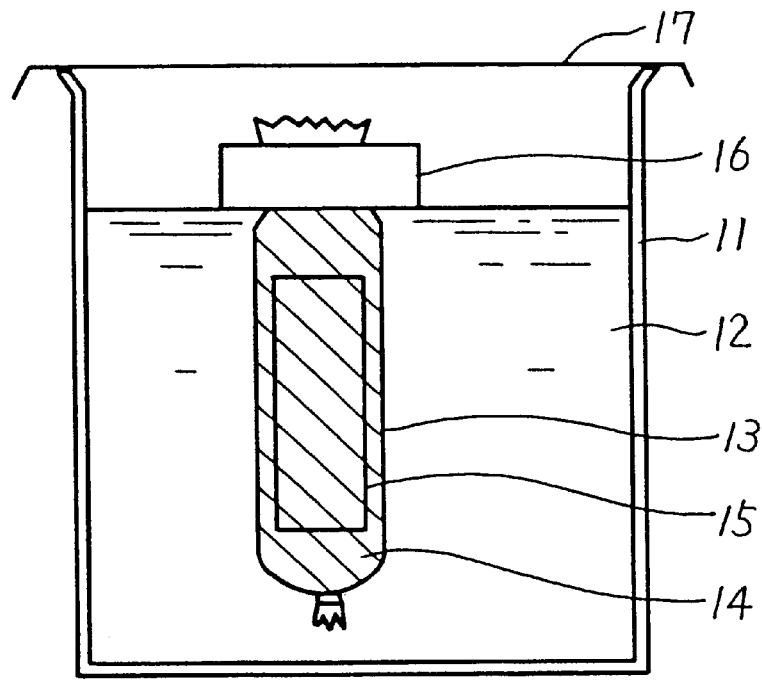
FIG. 2 is a typical diagram showing an example of an apparatus for carrying out the present invention.
Figure 3:
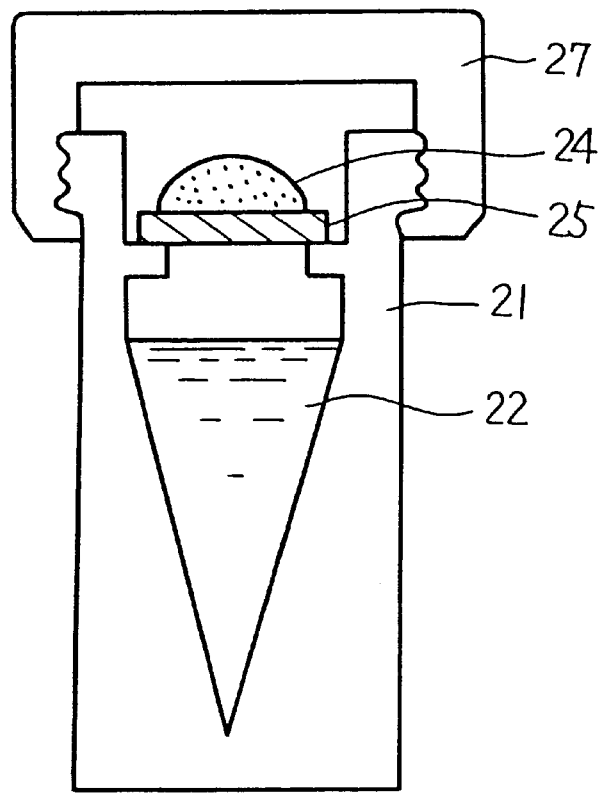
FIG. 3 is a typical diagram showing another example of an apparatus for carrying out the present invention.

FIG. 2 and FIG. 3 show more specific apparatuses for carrying out the present invention.

In the apparatus shown in FIG. 2, a buffer solution 12 is stored in a container 11, and a dialytic membrane tube 13 is provided therein. A solid-state component for crystallization control, such as a silicon crystal 15 doped with an impurity of a prescribed concentration, is stored in the dialytic membrane tube 13, along with a mother liquor 14 containing a biopolymer. The dialytic membrane tube 13 is sealed with a gasket 16, and dipped in the buffer solution 12. An opening of the container 11 is covered with a film 17. In this apparatus, dialysis is progressed, while a crystal of the biopolymer is going to be deposited on the silicon crystal 15 from the mother liquor 14. The apparatus shown in FIG. 3 is adapted to deposit a crystal on a solid-state component in a container 21 (made of glass, for example) in accordance with the present invention. A buffer solution 22 is stored in a lower part of the container 21. On the other hand, a silicon crystal 25 is placed on an upper part of the container 21, and a droplet 24 of a mother liquor containing a biopolymer is placed thereon. An opening of the container 21 storing the buffer solution 22 and the silicon crystal 25 receiving the droplet 24 is sealed with a cap 27. Between the buffer solution 22 and the droplet 24, a moderate equilibrium state is held with evaporation of volatile components in both of them, and crystal deposition of the biopolymer is made on the silicon crystal 25 according to the present invention.

Figure 4:
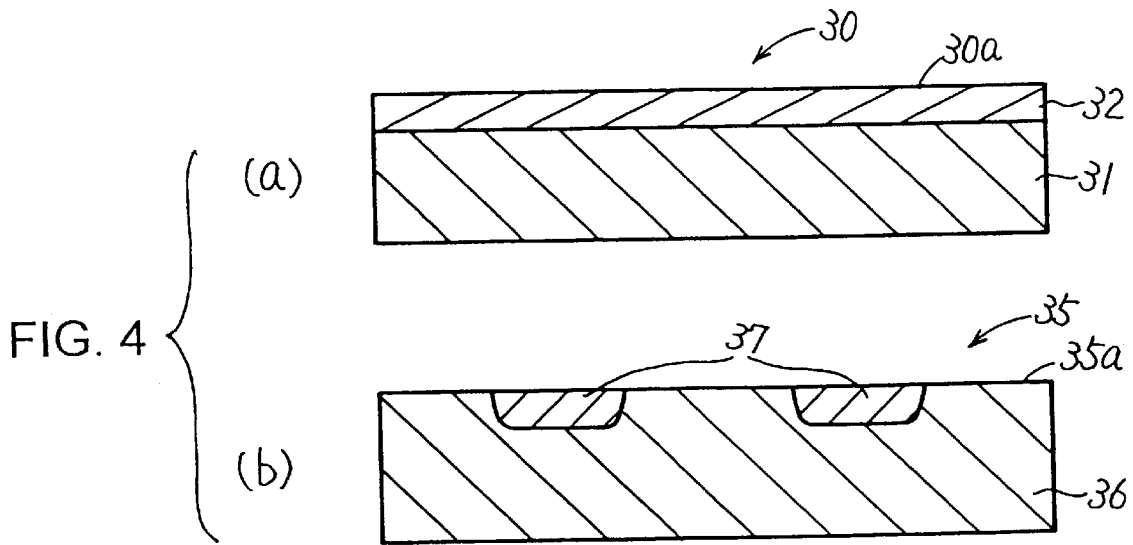
FIG. 4 shows schematic sectional views illustrating examples of structures of silicon crystals employed as solid-state components in the present invention.

The silicon crystal employed in the present invention may have either structure shown in FIG. 4, for example. In a silicon crystal 30 shown in FIG. 4(a), n-type silicon 32 is formed on p-type silicon 31, or p-type silicon 32 is formed on n-type silicon 31. According to this layered structure, a p-n junction part is formed. In a silicon crystal 35 shown in FIG. 4(b), n-type or p-type regions 37 are formed on p-type or n-type silicon 36. In both cases, surfaces 30a and 35a are preferably mirror-polished.

As understood from the above description, a space-charge layer is formed in the solid-state component according to the present invention, so that crystallization can be controlled by the surface electric potential based on the space-charge layer. The surface potential can be controlled by an impurity concentration in a semiconductor substrate employed as the solid-state component of the present invention, for example.

Figure 5:
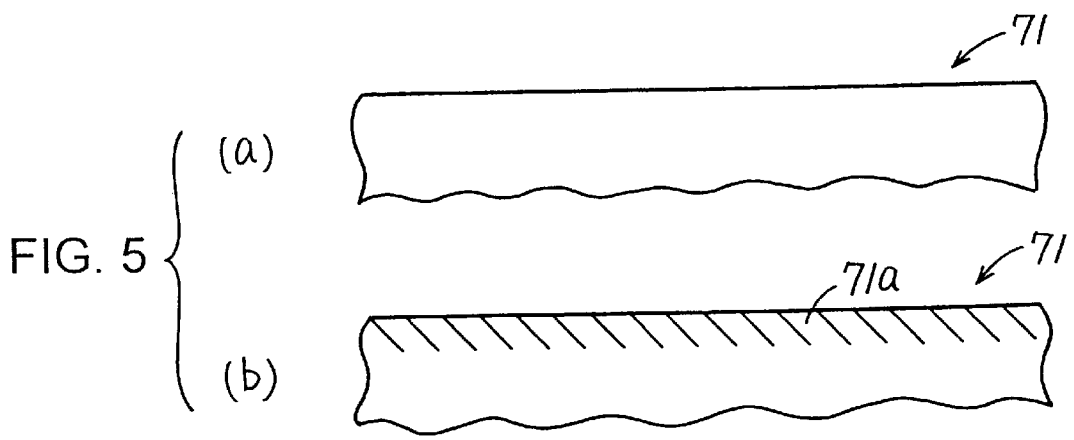
FIG. 5 shows schematic sectional views illustrating a process of forming the solid-state component of the present invention.

For example, a solid-state component which can exhibit a prescribed surface potential is obtained by preparing a semiconductor substrate 71 of high resistance as shown in FIG. 5(a), and introducing an impurity into a surface part to form a region 71a of low resistance (shown by slant lines) as shown in FIG. 5(b). In this solid-state component, the impurity concentration of the surface part and the impurity concentration in its interior are different from each other, and a space-charge layer is formed on the surface part.

Further, the surface potential may be so varied with the portion on the solid-state component surface that desired crystallization can be performed in a specific region having a surface potential suitable for crystallization on the solid-state component surface. Such setting of the surface potential can also be controlled by the concentration of an impurity contained in the solid-state component. Concrete examples of controlling crystallization on solid-state component surfaces by varying concentrations of impurities are now described.

Figure 6:
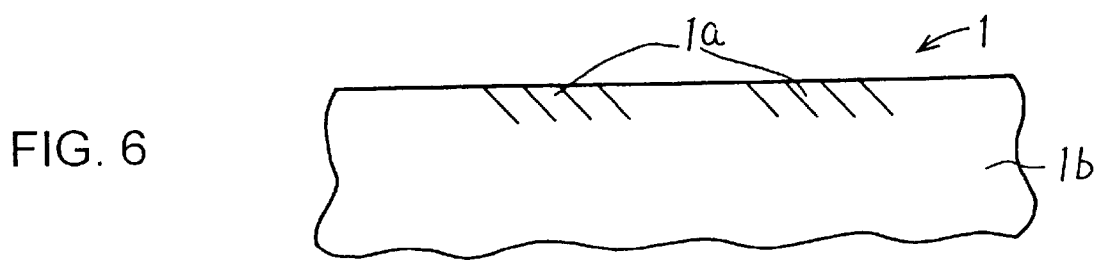
FIG. 6 is a schematic sectional view showing a solid-state component having regions different in impurity concentration from each other.

First, as shown in FIG. 6, regions 1a (shown by slant lines) having a high impurity concentration and a region 1b having a low impurity concentration can be intermixed with each other in a surface part of a solid-state component 1 for controlling crystallization. In general, a semiconductor substrate of silicon or the like is employed as the solid-state component 1. The impurity concentrations are set depending on the polarity and the charge quantity of the effective surface charges provided in the molecules to be crystallized. On the surface which comes into contact with the solvent in crystallization, the surface regions having a high impurity concentration are of low resistance, and the surface region having a low impurity concentration is of high resistance. Thus, the formation of crystal nuclei may be spatially controlled when organic compounds such as biopolymers aggregate on the solid-state component surface by electrostatic interaction. Namely, modes of crystallization (particularly crystallization rates) differ between the region of high resistance and the region of low resistance, and it is possible to facilitate crystallization in one region while suppressing crystallization in the other region. Thus, crystallization of a desired mode is enabled in a specific place of the solid-state component. Further, a nucleus of a crystal formed in the specific region is fixed to the solid-state component surface, and subtle movement of the nucleus resulting from convection or the like in the solvent is suppressed. Therefore, it is expected that the molecules are regularly assembled on the surface of the nucleus and the crystallinity is improved.

Figure 7:
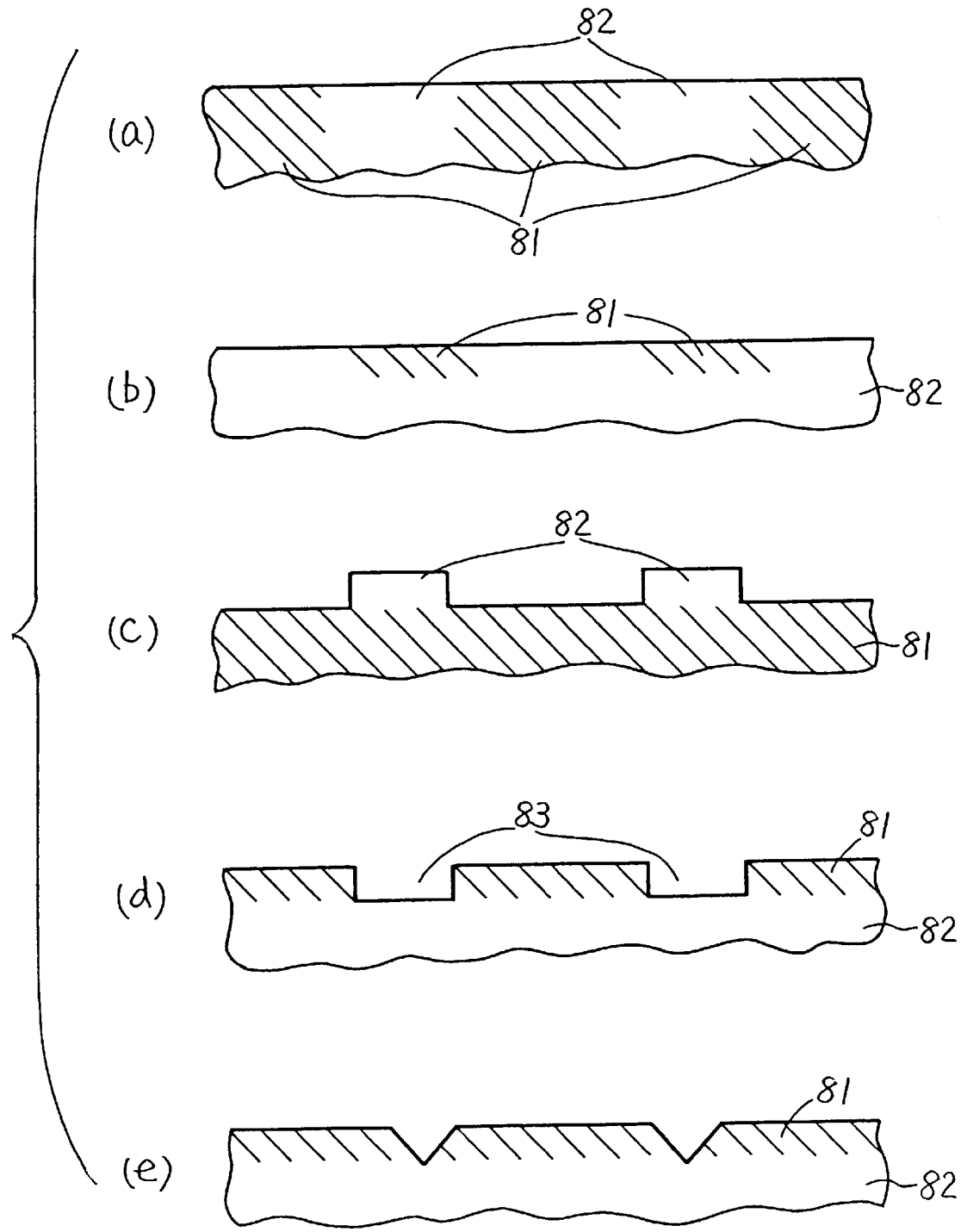
FIG. 7 shows schematic sectional views illustrating other solid-state components having regions different in impurity concentration from each other.

As concrete examples of the solid-state components having regions of different impurity concentrations, those shown in FIG. 7 can be provided, for example. FIG. 7(a) shows an example in which regions of high-resistance n(p)type silicon 82 are formed in low-resistance n(p)-type silicon 81. FIG. 7(b) shows an example in which regions of low-resistance n(p)-type silicon 81 are formed in high-resistance n(p)-type silicon 82 to the contrary. Referring to FIG. 7(c), patterns of high-resistance n(p)-type silicon 82 are formed on low-resistance n(p)-type silicon 81. Referring FIG. 7(d), a layer of low-resistance n(p)-type silicon 81 is formed on high-resistance n(p)-type silicon 82, and grooves 83 are formed in the parts of the layer. In such a structure, the high-resistance n(p)-type silicon is set in the low-resistance silicon 81, since the high-resistance n(p)-type silicon 82 is exposed on the bottoms of the grooves 83. Alternatively, the grooves may have the shape as shown in FIG. 7(e). In the solid-state component shown in FIG. 7(e), a layer of low-resistance n(p)-type silicon 81 having V-shaped grooves is formed on high-resistance n(p)-type silicon 82, and the high-resistance n(p)-type silicon 82 peeps out from the bottoms of the grooves. These high-resistance regions and low-resistance regions are formed by controlling the concentrations of impurities contained in silicon, as described above.

The solid-state components shown in FIGS. 7(a) and (b) can be formed by previously forming masks of resist or the like on the silicon substrate surfaces and locally implanting ions, in accordance with a general fabrication process for a semiconductor device or the like. While the solid-state components shown in FIGS. 7(c), (d) and (e) are also prepared by a technique employed in a general fabrication process for a semiconductor device, ions are first entirely implanted into the silicon substrate surfaces, and thereafter necessary patterns are formed by local etching employing resist or the like in these cases. On the solid-state component formed with grooves, a nucleus of a crystal tends to flow into the groove part rather than on the plane, to be readily stabilized in the groove. Thus, crystallization is facilitated by the groove. Among these solid-state components, (a) and (b) are advantageous for forming fine regions of not more than 1 μm. If fine patterns are not much required, on the other hand, (c) to (e) are also sufficient. Further, it is conceivable that (c) to (e) are advantageously applicable to the case of providing crystallization functions for micromachines, for example, since the grooves are formed on the silicon surfaces. While the examples employing silicon substrates have been illustrated, a similar solid-state component can be obtained by employing another semiconductor or still another material capable of valence electron control.

Figure 8:
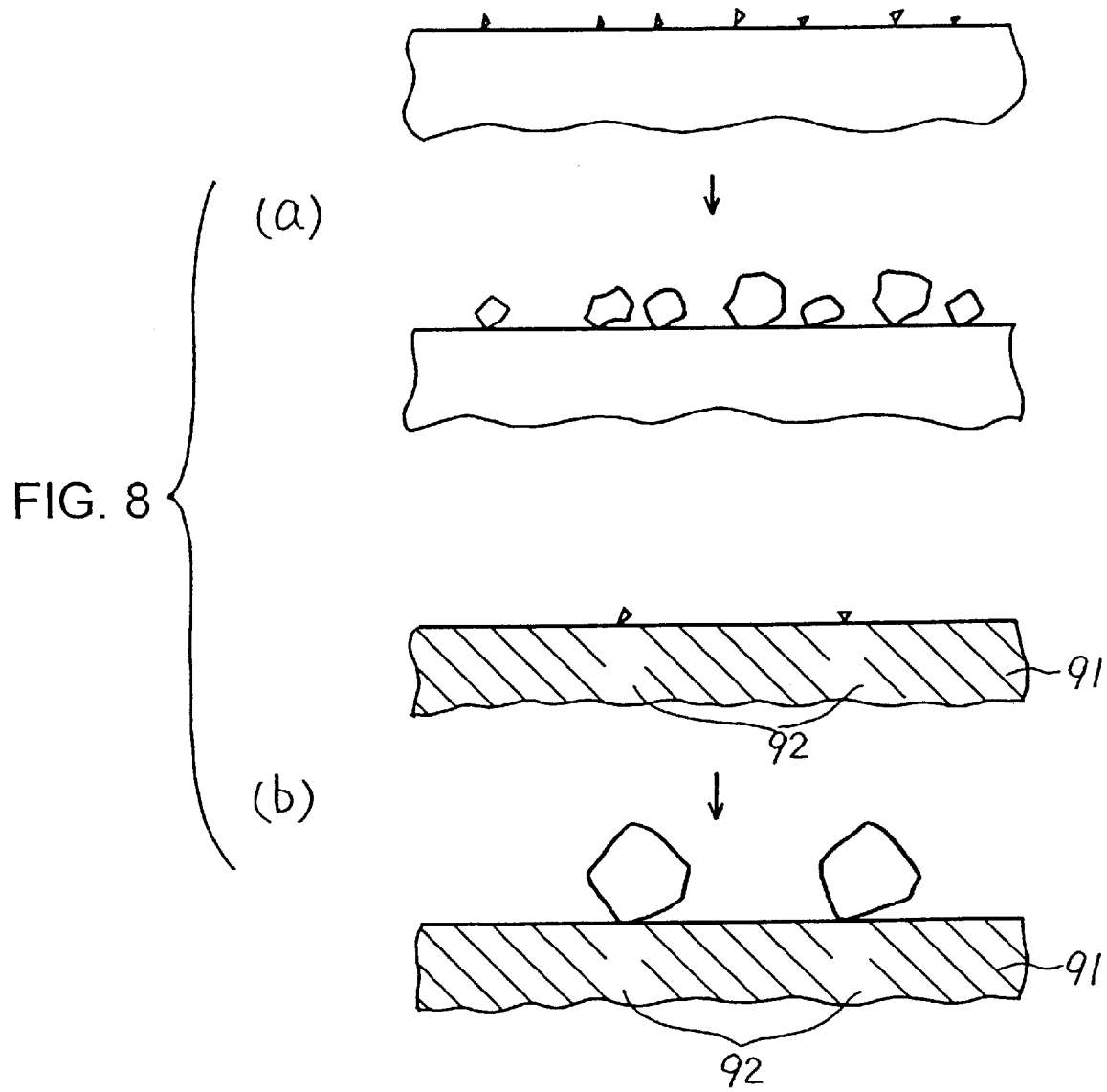
FIG. 8 shows schematic sectional views for illustrating such states that crystallization is controlled in solid-state components having regions different in impurity concentration from each other.

In case of intermixing the region of low resistance and the region of high resistance on the solid-state component surface, crystallization can be controlled in the mode as described below. When the surface of the solid-state component is of a uniform resistance value, nuclei of crystals are produced at random on this surface, and crystal growth takes place, as shown in FIG. 8(a). When crystal growth takes place in such arbitrary places of the solid-state component surface, a number of relatively small crystals are liable to be formed. When a region 91 of low resistance is studded with regions 92 of high resistance as shown in FIG. 8(b), on the other hand, the manners of formation of crystals vary with the regions. When substances have readily crystallized conditions (charged state and the like) with respect to the regions of high resistance, for example, nuclei of crystals are selectively formed on the high-resistance regions 92, while formation of crystal nuclei is suppressed in the other region. Therefore, growth of crystals selectively progresses on the high-resistance regions 92, and the crystals become relatively large. Thus, spatial control of crystallization is enabled by limiting the places where crystal nuclei are produced, and the sizes of the formed crystals can also be controlled.

In the present invention, regions having different impurity concentrations can be two-dimensionally arranged on the solid-state component surface. Namely, the regions having different impurity concentrations can be arranged in prescribed patterns in the solid-state component surface. The impurity concentrations are set depending on the polarity and the charge quantity of the effective surface charges provided in the molecules to be crystallized. Thus, when the molecules to be crystallized aggregate on the solid-state component surface by electrostatic interaction, even if charge distributions on the molecular surface subtly change by the pH of the solvent, denaturation of the molecules or the like, space charges compensating for the effective surface charges of the molecules are necessarily induced on the component surface. Then, it is expected that two-dimensional formation of crystal nuclei is readily and preferentially performed. Further, the formed crystal nuclei are fixed to the component surface and small movement of the nuclei resulting from convection or the like in the solvent can be suppressed, whereby it is expected that the molecules are regularly assembled on the surfaces of the two-dimensionally arranged crystal nuclei and the crystallinity is improved.

Figure 9:
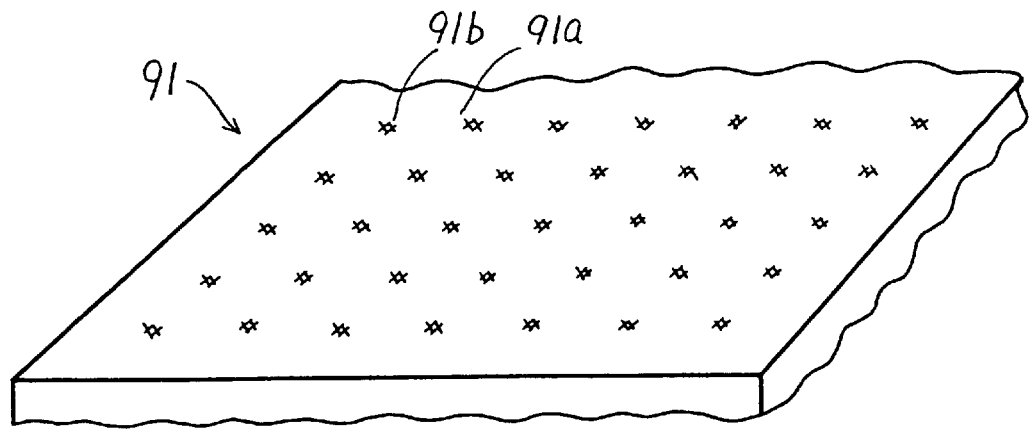
FIG. 9 is a perspective view showing a concrete example of the solid-state component in which regions different in impurity concentration from each other are two-dimensionally arranged.
Figure 10:
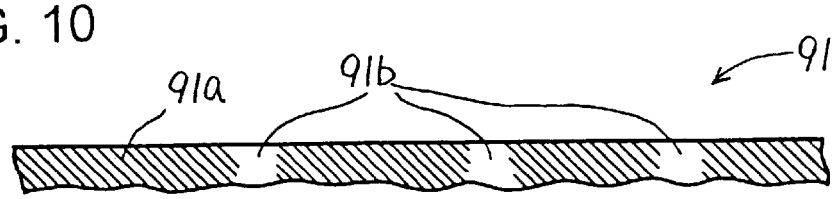
FIG. 10 is a schematic sectional view showing a part of the solid-state component of FIG. 9.
Figure 11:
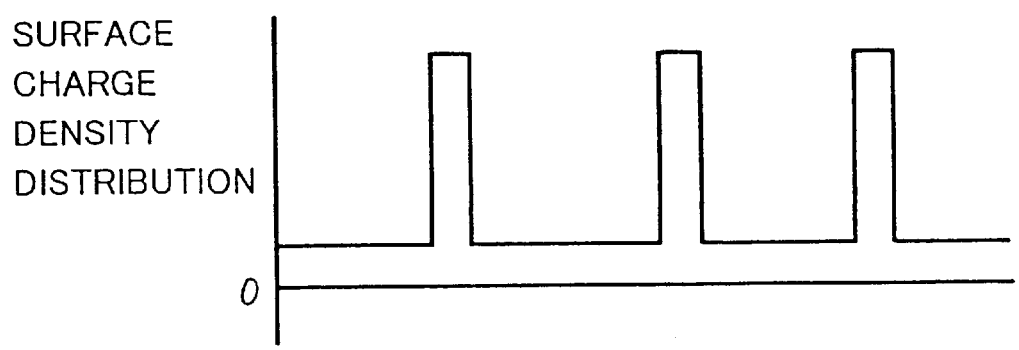
FIG. 11 is a diagram showing a surface charge density distribution in the part of the component shown in FIG. 10.
Figure 12:
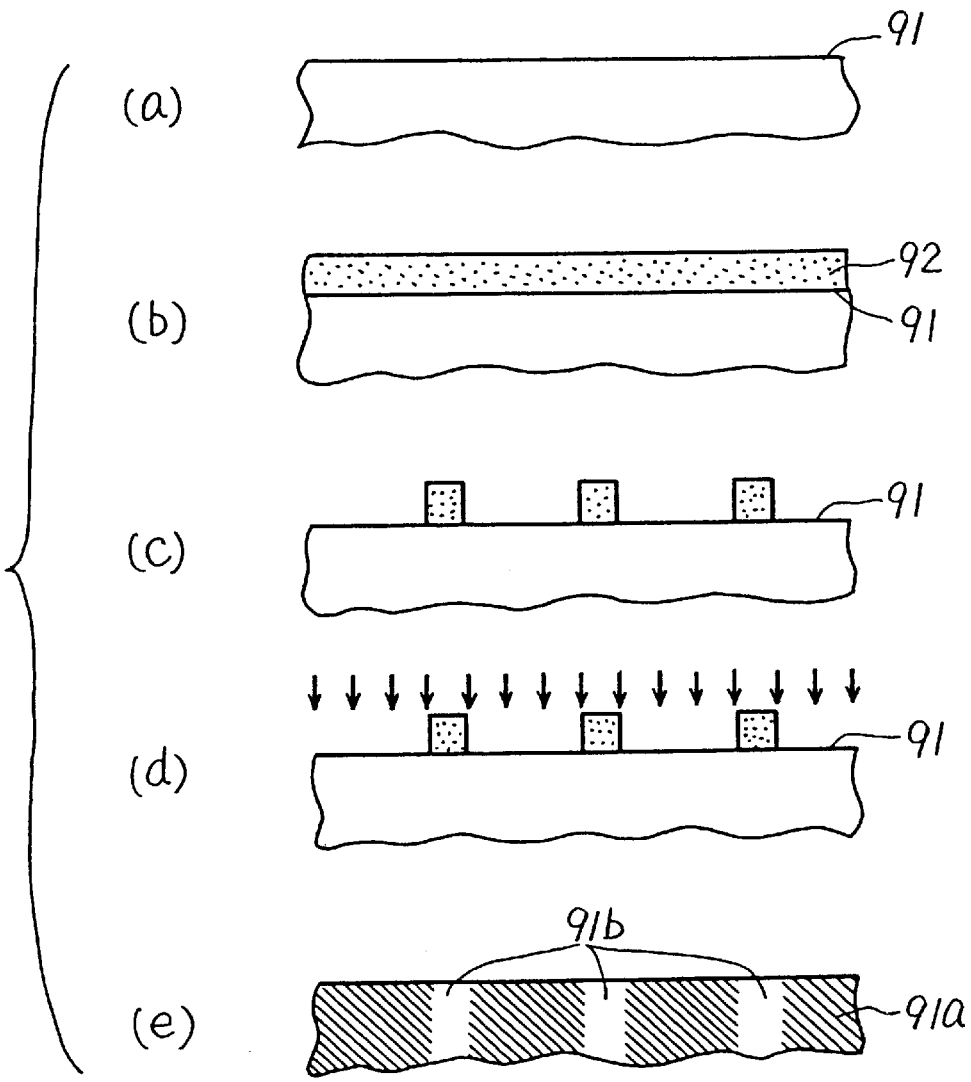
FIG. 12 shows schematic sectional views showing an example of a fabrication process for the solid-state component shown in FIG. 9.

A concrete example of the solid-state component which two-dimensionally arranges the regions having a different impurity concentration is hereafter shown. In a solid-state component shown in FIG. 9, for example, regions 91b (low impurity regions) having a low impurity concentration are regularly arranged to form a matrix, in a region 91a (high impurity region) having a high impurity concentration. In the vertical and transverse rows of the low impurity regions 91b, the intervals between the regions are substantially equal to each other. FIG. 10 shows a section of a part of the solid-state component shown in FIG. 9. In the silicon substrate 91, the low impurity regions 91b are formed substantially at equal intervals on the surface part. FIG. 11 shows a distribution of surface charge densities in the part of the component shown in FIG. 10. Such a solid-state component can be prepared as follows, for example: A silicon substrate 91 having a low impurity concentration is prepared as shown in FIG. 12(a), and a resist film 92 is formed thereon as shown in FIG. 12(b). Resist patterns are formed by a general method (FIG. 12(c)), and thereafter ion implantation of an impurity is performed (FIG. 12(d)). When the resist is then removed, obtained is a solid-state component for crystallization control in which low impurity regions 91b are arranged in a high impurity region 91a (FIG. 12(e)). The low impurity regions include not only regions containing an impurity in a prescribed low concentration, but regions hardly containing the impurity or regions substantially free from the impurity.

Figure 13:
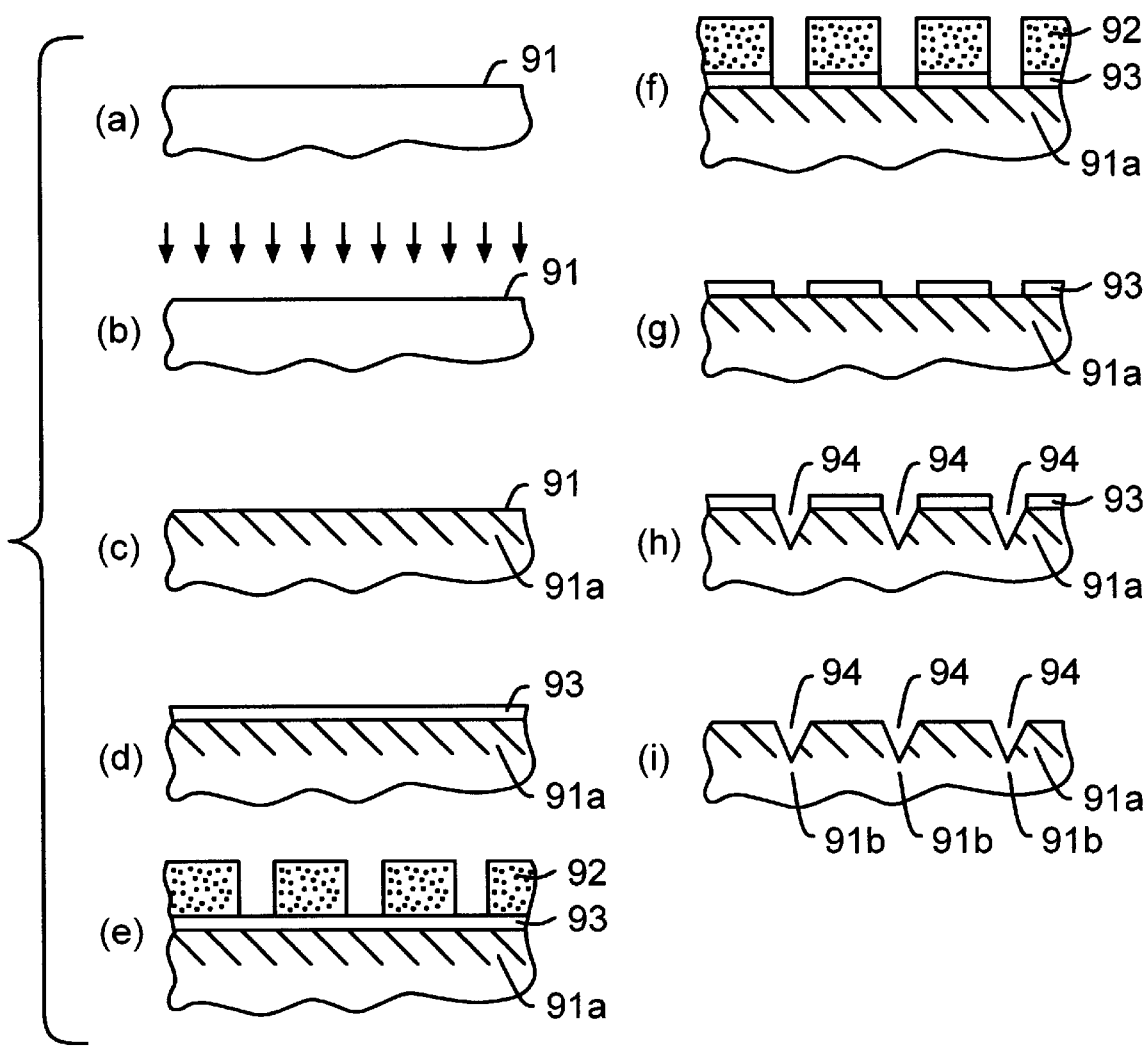
FIG. 13 shows schematic sectional views illustrating one example of a fabrication process for a solid-state component having grooves.

A crystallization control solid-state component can also be prepared by the process shown in FIG. 13. A silicon substrate 91 having a low impurity concentration is prepared, and then ion implantation of an impurity is performed on its overall surface, to form a high impurity region 91a (FIGS. 13(a), (b) and (c)). Then, an oxide film 93 is formed thereon (FIG. 13(d)), whereafter resist films 92 are deposited to form patterns (FIG. 13(e)). Parts of the oxide film not covered with the resist films are removed by etching (FIG. 13(f)), and then the resist patterns are removed (FIG. 13(g)). Grooves 94 are formed by anisotropically etching the high impurity region 91a of the silicon substrate through the oxide film 93 (FIG. 13(h)). A crystallization control solid-state component having V-shaped grooves 94 can be obtained by removing the oxide film (FIG. 13(i)). In this solid-state component, low impurity regions 91b peep out from the bottoms of the grooves 94 formed substantially at equal intervals, and in such a structure, the low impurity regions are arranged in the high impurity region, similarly to that shown in FIG. 9. While silicon substrates have been employed in the aforementioned solid-state components, another semiconductor or still another material capable of valence electron control can be employed. Further, the arrangement patterns of the regions having different impurity concentrations can be varied depending on the crystal system or the like of the target molecules.

In relation to crystal formation of protein molecules, it has been reported that an initial process of nucleation thereof is important. Yonath et al. have observed a crystallization initial process of a gigantic ribosome subunit extracted by Bacillus stearothermophilius. According to them, it has been mentioned that it is essential for the progress of crystallization that the respective molecules aggregate while taking a two-dimensionally regular structure (network, stellate, staggered or the like) as an initial process (Biochemistry International, Vol. 5, 629–636 (1982)). It is not clear whether or not this is essential in common to all substances. Considering protein molecules which are generally hard to aggregate since intermolecular interaction is weak and the molecular surfaces are locally charged, however, it is conceivable that, when the molecules serving as nuclei are two-dimensionally arranged in a state readily forming crystals in an initial process of crystallization, subsequent growth of crystals epitaxially smoothly progresses with the arranged molecules as nuclei.

Figure 14:
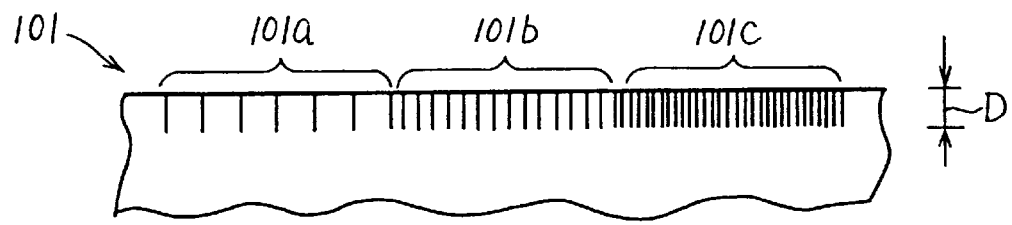
FIG. 14 is a schematic sectional view showing a concrete example of a solid-state component whose impurity concentration stepwisely changes.
Figure 15:
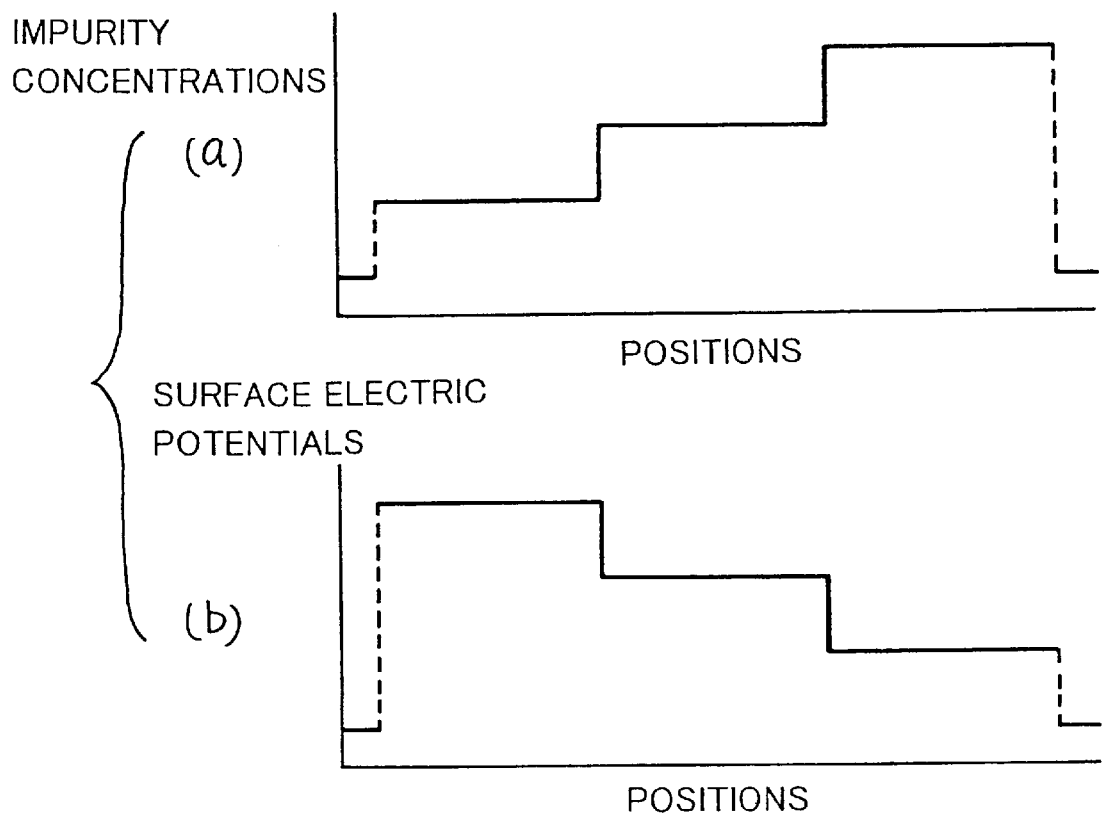
FIG. 15 shows diagrams illustrating a distribution of impurity concentrations and change of a surface electric potential in the solid-state component shown in FIG. 14.

While the examples where the impurity concentrations drastically change in the specific regions are shown in the above, the impurity concentrations may stepwisely or continuously change in the solid-state component. FIG. 14 shows a concrete example having stepwisely changing impurity concentrations. In a solid-state component shown in FIG. 14, three regions having different impurity concentrations are formed on the surface part of a silicon substrate 101 of high resistance, with a thickness D ($\mu$m). A first region 101a has the lowest impurity concentration, and the impurity concentrations increase in order of a second region 101b and a third region 101c. The levels of the impurity concentrations are expressed by the densities of vertical lines in the figure, and the third region 101c having the highest density of the vertical lines has the highest impurity concentration. The relation between the surface positions and the impurity concentrations in the solid-state component shown in FIG. 14, and the relation between the surface positions and the surface electric potentials are shown in FIG. 15(a) and FIG. 15(b) respectively. Referring to FIG. 15(a) and FIG. 15(b), the horizontal axes show the positions on the solid-state component, and the vertical axes show the impurity concentrations and the surface potentials respectively.

Figure 16:
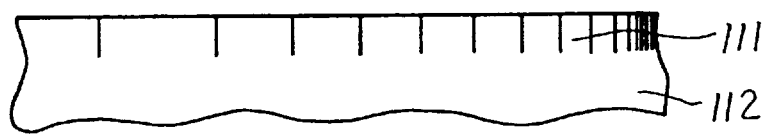
FIG. 16 is a schematic sectional view showing one concrete example of a solid-state component whose impurity concentration continuously changes.
Figure 17:
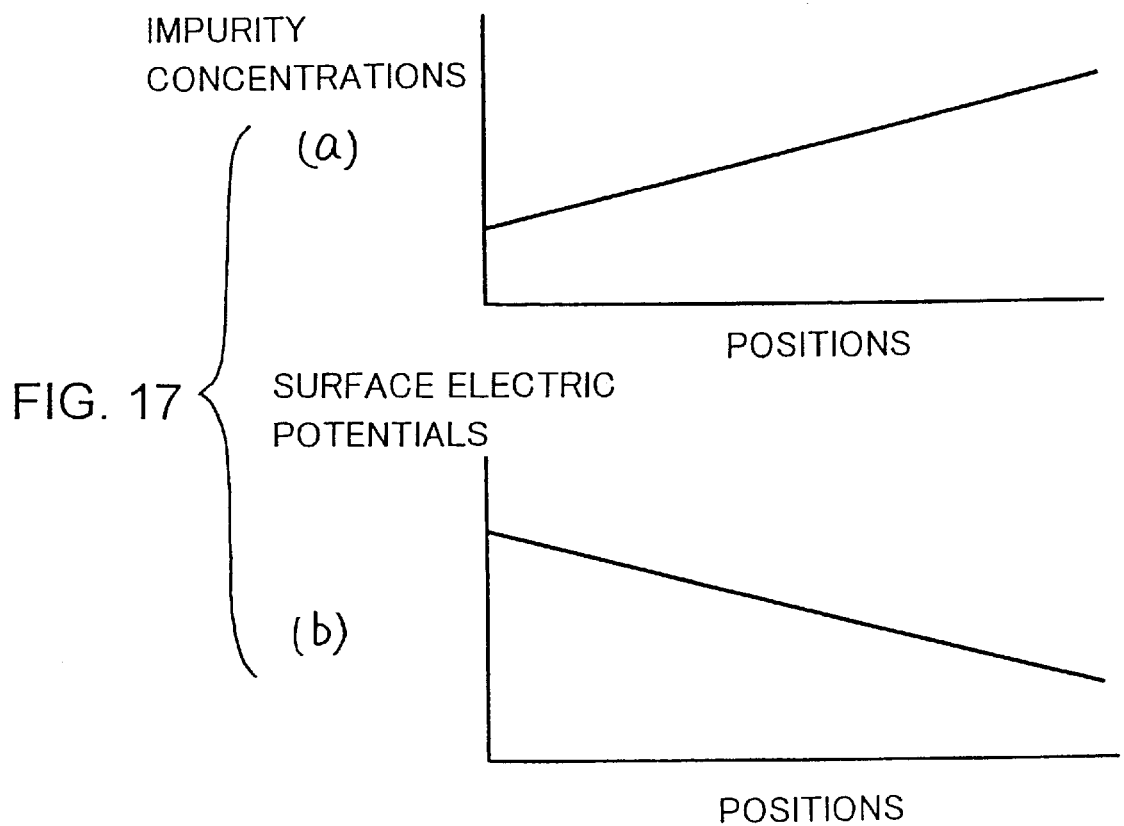
FIG. 17 shows diagrams illustrating a distribution of impurity concentrations and change of a surface electric potential in the solid-state component shown in FIG. 16.

On the other hand, it is also possible to continuously change impurity concentrations, as described below. In a solid-state component shown in FIG. 16, a low-resistance layer 111 having a high impurity concentration is formed on a high-resistance layer 112 having a low impurity concentration, and an impurity in the low-resistance layer 111 has a concentration gradient. Namely, the concentration of the impurity increases at a constant rate, as going from the left region toward the right region, as shown by the densities of vertical lines of the figure. The change of the impurity concentration on the surface position of the solid-state component and the change of the surface electric potential are shown in FIG. 17(a) and FIG. 17(b) respectively. As shown in the figures, the impurity concentration increases in a constant gradient, and the surface potential reduces in a constant gradient.

In a solid-state component shown in FIG. 18, a region having the lowest impurity concentration exists in the central portion and the impurity concentration increases as separating therefrom, in a low-resistance layer 121 formed on a high-resistance layer 112. The relation between the surface positions and the impurity concentration and between the surface positions and the surface potentials are shown in FIG. 19(a) and FIG. 19(b) respectively.

Figure 20:
FIG. 20 is a schematic sectional view showing a concrete example of a solid-state component provided with a region having the highest impurity concentration in its central portion.
Figure 21:
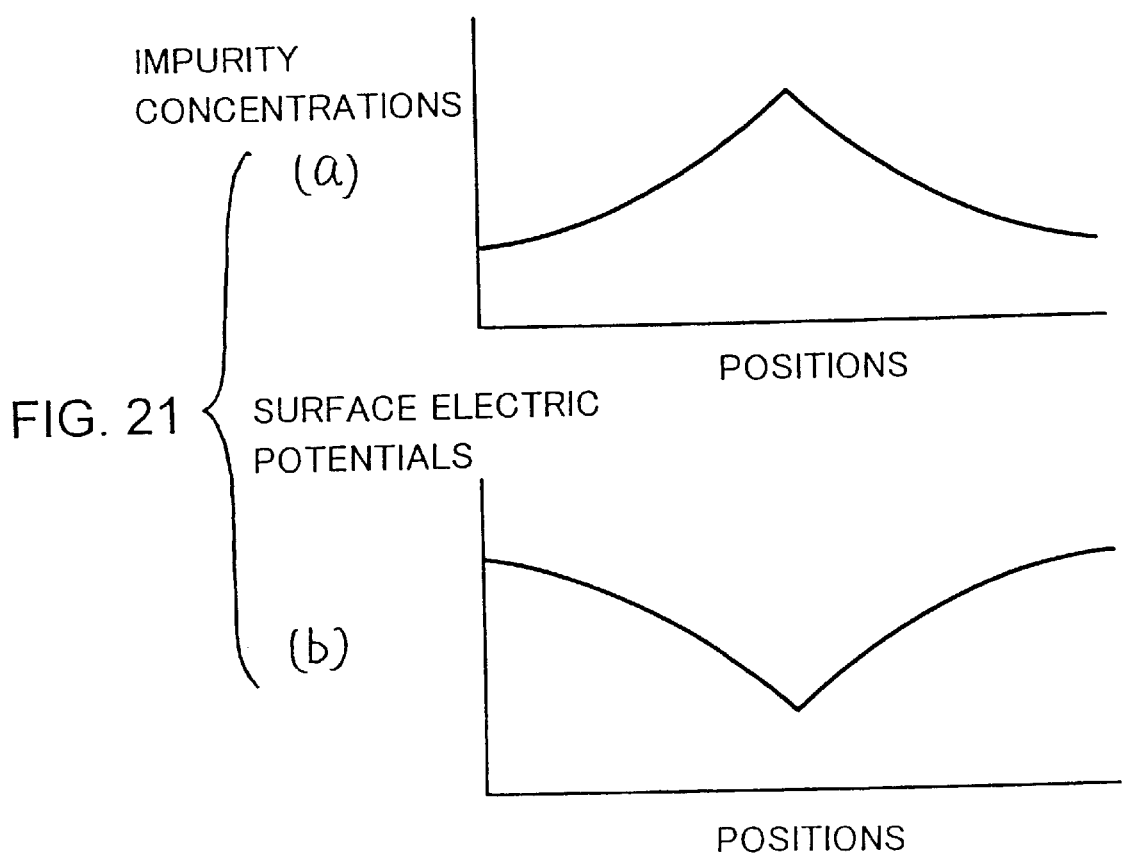
FIG. 21 shows diagrams illustrating a distribution of impurity concentrations and change of a surface electric potential in the solid-state component shown in FIG. 20.

In a solid-state component shown in FIG. 20, a region having the highest impurity concentration is formed in the central portion and the impurity concentration lowers as separating therefrom in a low-resistance layer 131 formed on a high-resistance layer 112, to the contrary. The relations between the surface positions and the impurity concentration and between the surface positions and the surface potentials are shown in FIGS. 21(a) and 21(b) respectively.

For the progress of crystallization, it is important that nuclei serving as origins of crystals are formed. When these nuclei are formed everywhere at random, the crystals become relatively small ones. In the solid-state components shown in FIGS. 14, 16, 18 and 20, the surface potentials based on the space-charge layers induced in the surface parts thereof also change in proportion to the impurity concentrations. Therefore, electrostatic properties are adjusted depending on the positions of the solid-state component, so that a position having a suitable electrostatic property for the target molecule crystal may be provided. Even if the charge distribution in the surface of the molecule to be crystallized subtly vary with the pH of the solution or denaturation of the molecule, therefore, the space charges compensating for the effective surface charges of the molecule are necessarily induced in some portions of the solid surface, whereby the formation and control of crystal nuclei are readily performed. When the aforementioned solid-state components are employed, therefore, it is expected that the progress of the formation of nuclei and the crystal growth center on the place which has a surface potential convenient for crystallization and a large-sized crystal is obtained. Namely, a crystal largely grows about a prescribed place as the center. The formed crystal nuclei are fixed to the component surface and small movement of the nuclei resulting from convection or the like in the solvent is suppressed, whereby it is expected that the molecules regularly aggregate around the nuclei and the crystallinity is improved. When the solid-state components shown in FIGS. 14 and 16 are employed, the region having a surface potential suitable for crystallization is conveniently formed over a relatively wide area to form a crystal there. When the solid-state components shown in FIGS. 18 and 20 are employed, on the other hand, they are conceivably suitable for locally performing crystallization in extremely limited regions.

Based on the above, now described is a mechanism in the case of employing the n-type silicon having a high-resistance region and a low-resistance region and crystallizing molecules (protein molecules, for example) charged in minus in a solvent. In the case of the n-type silicon, a depletion layer capacitance is small in a high-resistance substrate since a dopant concentration is low and a wide space-charge layer is formed in the vicinity of the surface, and hence it is expected that the surface potential induced on the silicon surface is higher than that in the case of a low-resistance substrate. This surface potential is reversed in polarity to the effective surface potential provided in the molecules to be crystallized, whereby aggregation of the molecules is promoted by the action of electrostatic attractive force. When an island of high-resistance silicon is formed in a limited region of the low-resistance silicon surface, therefore, it is expected that the molecules to be crystallized are hard to deposit in the low-resistance silicon region, and that crystallization progresses with selective deposition on the region of high-resistance silicon. When an impurity is doped into a high-resistance n-type silicon substrate with the impurity concentration gradually changed to form a surface layer of low resistance in which the resistance continuously changes, it is expected that crystallization is selectively performed at a portion where the balance is kept with the effective charges of the surface of the molecule to be crystallized, in the low-resistance silicon region of the surface. While description has been made as to the case of employing n-type silicon, crystallization can be controlled by a similar mechanism by employing p-type silicon, in crystallizing the molecules charged in plus in a solvent.

Figure 22:
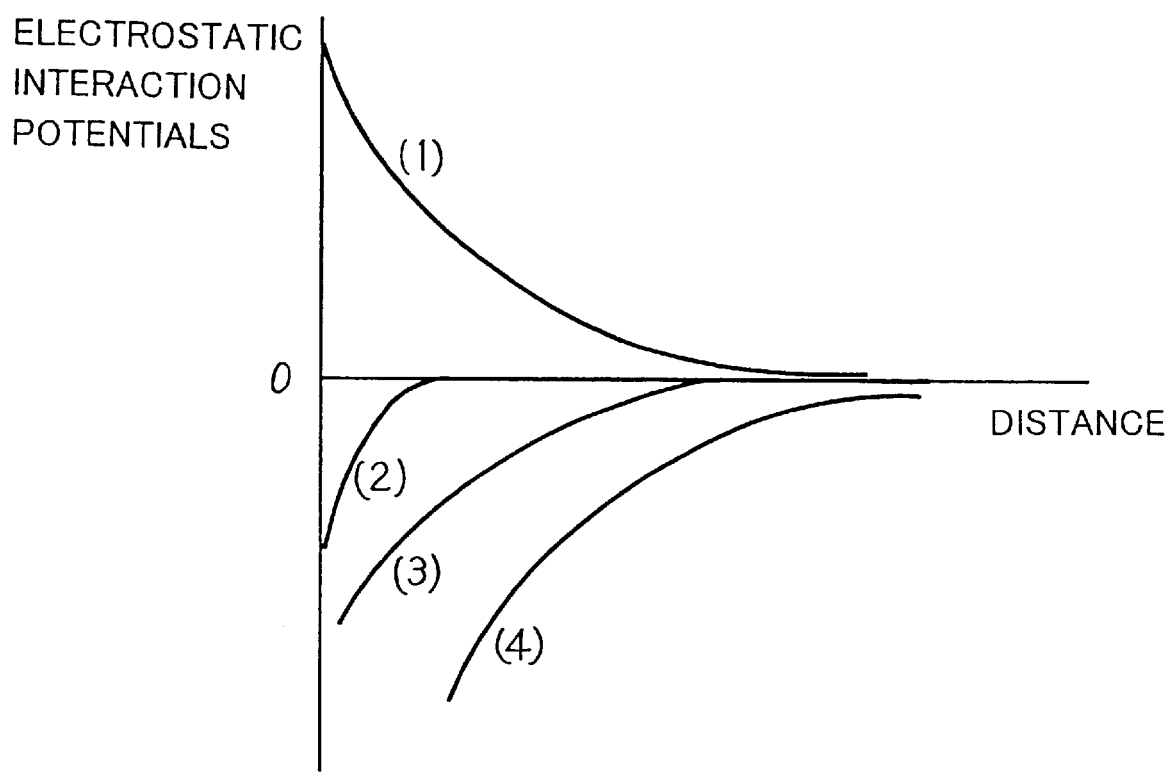
FIG. 22 is a diagram for illustrating an electrical aggregation effect between a valence-electron-controlling silicon substrate and molecules to be crystallized by electrostatic interaction potentials in the electric double layer.
Figure 23:
FIGS. 23, 24, 25 and 26 are microphotographs of crystal structures formed in Example 1.
Figure 24:
Figure 25:
Figure 26:

FIG. 22 is a diagram for illustrating electrical aggregation effects between the aforementioned silicon substrate and a protein molecule and between a plurality of protein molecules, by electrostatic interaction potentials in the electrical double layer. Referring to FIG. 22, a curve (1) shows the potential energy between the protein molecules of the same polarity (assumed to be negative polarity), and repulsive force regularly acts. On the other hand, a curve (4) is an interaction energy curve between the protein molecule and an n-type silicon substrate region of a low impurity concentration, and large attraction regularly acts between them. An interaction energy curve between the protein molecule and an n-type silicon substrate region of a high impurity concentration is (3), and attraction regularly acts while its interaction energy is low as compared with the curve (4). A curve (2) is an interaction potential curve between a protein molecule whose surface charge is so compensated that the surface potential is zero volt and a protein molecule of negative polarity. It is understood that attraction gets to regularly act by the fact that the surface charge of one molecule becomes zero, though repulsive force regularly acts as the intermolecular force in the curve (1).

While the present invention is now more concretely illustrated, the scope of the present invention is not restricted by the following concrete examples.

EXAMPLES

Example 1

In order to investigate whether protein crystals are formed depending on the defective density of silicon surface, the following experiment was made: Hen egg white lysozyme (Lysozyme, from Chicken Egg White) was dissolved in a standard buffer solution of pH=9.18 in a concentration of 50 mg/ml, and 3 ml thereof was enclosed in a sufficiently boiled/washed dialytic tube with a silicon crystal. As such a silicon crystal, those of the following four types were employed respectively. Specific resistance values of p-type silicons are all 10 to 20 $\Omega$cm.

(1) Epitaxial Wafer: p on p+, provided with a surface oxide film of about 50 nm (2) Epitaxial Wafer: p on p+, wherein a surface oxide film is removed (3) CZ Wafer: p-type, provided with a surface oxide film of about 50 nm (4) CZ wafer: p-type, wherein a surface oxide film is removed Surface crystal defects of the CZ silicon wafers (wafers of a silicon single crystal pulled by the Czochralski method) are about 10 per square centimeter unit while surface defects of the epitaxial silicon wafers are substantially zero, so that surface defect density dependency of protein crystal growth can be investigated by employing these crystals. The aforementioned silicon crystals of (1) to (4) were cut into sizes of about 2 by 5 mm, and dipped in dialytic tubes containing lysozyme. Further, these dialytic tubes were dipped in standard buffer solutions (20 ml) of pH=8.9, and kept in a cool dark place of 10° C. The apparatus for crystal deposition is as shown in FIG. 2, for example.

After kept in the cool dark place for 72 hours, the samples were taken out and crystals of lysozyme were observed with a microscope. FIG. 23 to FIG. 26 show the results of the aforementioned Example. FIG. 23, FIG. 24, FIG. 25 and FIG. 26 correspond to those employing the silicon crystals of (1), (2), (3) and (4) respectively. The figures demonstrate that presence/absence of the defects on the crystal surfaces exerts no influence at all on the formation of crystal nuclei and the crystal growth of lysozyme.

Example 2

An aqueous solution of lysozyme having the same concentration as Example 1 was employed, for making the following experiments. The following silicon crystals were prepared.

(1) Sample forming n-type Silicon Layer on p-type Substrate

A p-type silicon wafer having a specific resistance of 10 to 20 Ωcm was subjected to ion implantation of phosphorus in a dose of $10^{13}/cm^2$, and then annealed in nitrogen at 1150° C. for 8 hours, for forming an n-type layer. The specific resistance of the n-type layer was 0.1 to 1.0 Ωcm, and the depth of the layer was 3 to 4 μm. This sample is referred to as sample-1.

(2) Sample forming p-type Silicon Layer on n-type Substrate

An n-type silicon wafer having a specific resistance of 5 to 10 Ωcm was subjected to ion implantation of boron in a dose of $10^{13}/cm^2{}_1$, and then annealed in nitrogen at 1150° C. for 8 hours, for forming a p-type layer. The specific resistance of the p-type layer was 0.1 to 1.0 Ωcm, and the depth of the layer was 3 to 4 μm. This sample is referred to as sample-2.

The aforementioned silicon samples of (1) and (2) were worked into sizes of about 2 by 5 mm, washed, and then enclosed in dialytic tubes with 3 ml of the aqueous solutions of lysozyme. The pHs of the standard buffer solutions as the outer liquids were set at 6.9 and 4.01.

Figure 27:
FIGS. 27, 28, 29 and 30 are microphotographs of crystal structures formed in Example 2.
Figure 28:
Figure 29:
Figure 30:

FIG. 27 to FIG. 30 show the resulting crystals of lysozyme grown on the silicons after keeping in a cool dark place of 10° C. for 72 hours. FIG. 27 shows the result from the employment of sample-1 and the buffer solution of pH 6.9, FIG. 28 shows the result from the employment of sample-1 and the buffer solution of pH 4.01, FIG. 29 shows the result from the employment of sample-2 and the buffer solution of pH 6.9, and FIG. 30 shows the result from the employment of sample-2 and the buffer solution of pH 4.01.

(1) Sample-1

It is understood that crystals of lysozyme disorderedly deposit on the wafer surface in the case of performing dialysis with the buffer solution of pH=6.9. It is understood that crystals of lysozyme also still disorderedly deposit in the case of employing the buffer solution of pH=4.01 though the crystal sizes are slightly large.

(2) Sample-2

In the case of performing dialysis with the buffer solution of pH=6.9, lysozyme crystals of large sizes of about 0.5 mm deposit. In the case of employing the buffer solution of pH=4.01, large lysozyme crystals of about 0.5 mm still deposit. From the above, crystal growth is excellent in sample-2 as compared with sample-1, and it indicates that control of crystal growth is enabled by forming a p-type layer on an n-type silicon wafer by valence electron control of a silicon substrate, by control of doping to the silicon wafer in this case.

From the results shown in the aforementioned Examples, it has been found that crystallization of biopolymers can be controlled on semiconductor crystal surfaces which have valence electrons controlled.

Example 3

An aqueous solution of lysozyme having the same concentration as Example 1 was employed, for making the following experiments. The following silicon crystals were prepared.

(1) p-type CZ Wafer (wherein an oxide film is removed), with a specific resistance of 10 to 20 Ωcm (2) n-type CZ Wafer (wherein an oxide film is removed), with a specific resistance of 4 to 8 Ωcm The aforementioned silicon samples (1) and (2) were worked into sizes of about 2 by 5 mm, washed and then enclosed in dialytic tubes with 3 ml of the aqueous solution of lysozyme. The standard buffer solutions of the external liquids were prepared in two types of PH 9.1 and PH 6.9.

Figure 31:
FIGS. 31, 32, 33 and 34 are microphotographs of crystal structures formed in Example 3.
Figure 32:
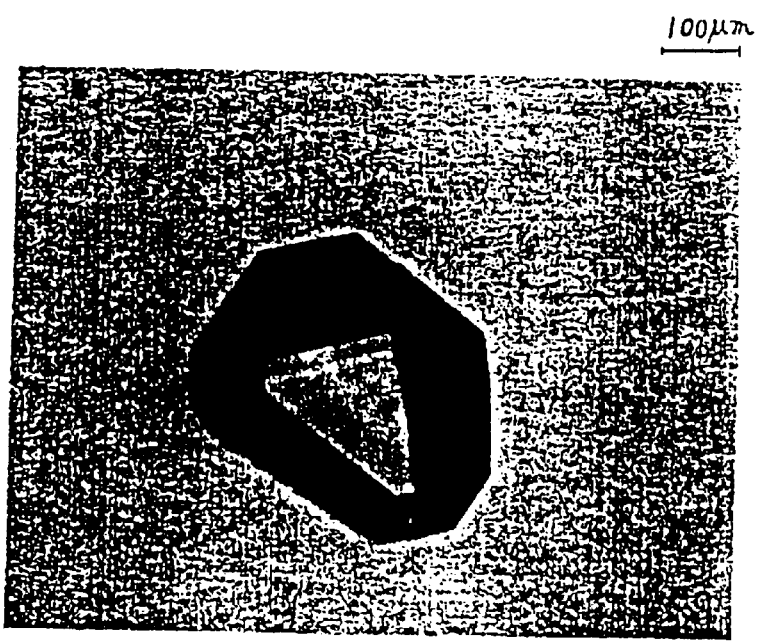
Figure 33:
Figure 34:

FIG. 31 to FIG. 34 show the resulting crystals of lysozyme grown on silicon after keeping in a cool dark place of 10° C. for 72 hours. FIG. 31, FIG. 32, FIG. 33 and FIG. 33 correspond to the condition of the silicon (1) and pH 9.1, the condition of the silicon (2) and pH 9.1, the condition of the silicon of (1) and pH 6.9, and the condition of the silicon (2) and pH 6.9 respectively.

In the case of performing dialysis with the buffer solution of pH=9.1, crystals of lysozyme disorderedly deposit on the p-type CZ wafer surface. On the other hand, it is apparent that only relatively large-sized crystals deposit in a small quantity on the n-type CZ wafer surface. In the case of pH=6.9, crystal growth disorderedly takes place in both of the p type and the n type, and it is understood that there is no significant difference. From these results, it can be inferred that the molecules have negative charges as a whole in the case of pH=9.1 since the carboxyl groups that are acid groups among the hydrophilic amino acids in the lysozyme molecules mainly dissociate, and the lysozyme molecules aggregate and crystallize so as to compensate for the space charges on the non-ohmic n-type silicon surface. In the case of the neutral buffer solution of pH=6.9, on the other hand, it is inferred that crystal growth disorderedly progresses since the positive and negative substantially electrostatically balance with each other in the lysozyme molecules and ohmic properties are provided for both ptype and n-type silicon surfaces.

The results shown in the aforementioned Example reveal that since the charge distributions on the surface of the biopolymer to be crystallized vary with the pH of the solution, it is effective for the crystallization control of the biopolymer to employ a semiconductor substrate in which the valence electrons are controlled according to the properties of the biopolymer.

Figure 35:
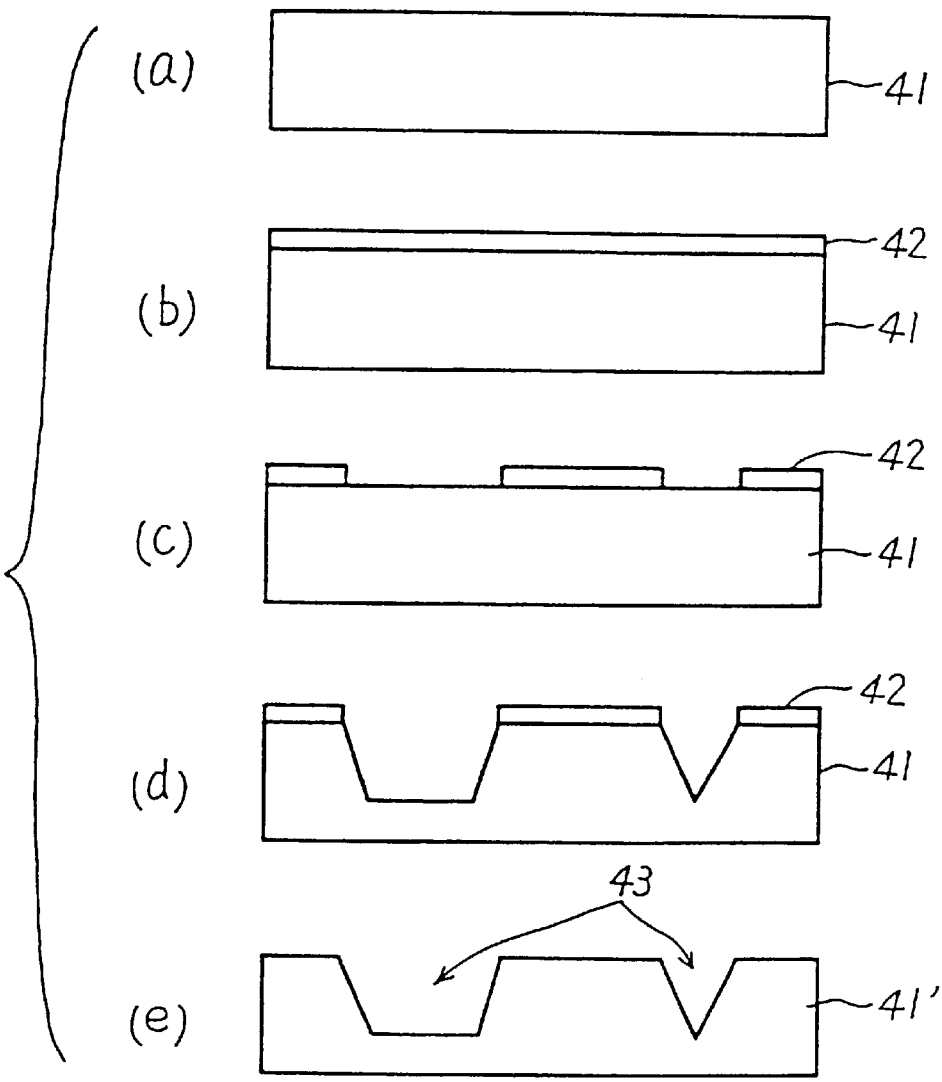
FIG. 35 shows typical diagrams showing a process of forming grooves on a silicon substrate.

An example employing the solid formed with grooves is now described. The grooves can be formed as shown in FIG. 35, for example. First, a silicon substrate 41 is prepared (FIG. 35(a)). Then, an $SiO_2$ film 42 is formed on the substrate 41 (FIG. 35(b)). After the $SiO_2$ film 42 is etched into the prescribed pattern (FIG. 35(c)), the silicon substrate is etched by general anisotropic etching, for example (FIG. 35(d)). A silicon substrate 41' having grooves 43 is obtained by then removing the $SiO_2$ film.

Example 4

An aqueous solution of lysozyme having the same concentration as Example 1 were employed, for making the following experiments. The following silicon crystals were prepared.

(1) Sample forming p-type Silicon Layer on n-type Substrate

An n-type silicon wafer having a specific resistance of 5 to 10 Ωcm was subjected to ion implantation of boron in a dose of $10^{13}/cm^2$, and then annealed in nitrogen at 1150° C. for 8 hours, for forming a p-type layer. The specific resistance of the p-type layer was 0.1 to 1.0 Ωcm, and the depth of the layer was 3 to 4 μm. This sample is referred to as sample-1.

(2) Sample forming p-Type Silicon Layer on n-type Substrate and then forming Concave Groove Part by Chemical Etching An n-type silicon wafer having a specific resistance of 5 to 10 Ωcm was subjected to ion implantation of boron in a dose of $10^{13}/cm^2$, and then annealed in nitrogen at 1150° C. for 8 hours, for forming a p-type layer. The specific resistance of the p-type layer is 0.1 to 1.0 Ωcm, and the depth of the layer is 3 to 4 μm. Then an $SiO_2$ film of about 200 nm was formed on the sample surface by a thermal CVD apparatus, and then the $SiO_2$ film on the surface was etched to form a pattern whose lines and spaces were 500 μm respectively. This was dipped in an aqueous solution of potassium hydroxide (KOH) to form V-shaped groove parts by anisotropic etching. The depth of the groove parts was 5 μm. Finally the $SiO_2$ film of the surface was removed to expose silicon on the surface. The sample obtained in the aforementioned manner is referred to as sample-2.

The aforementioned silicon samples (1) and (2) were worked into sizes of about 2 by 5 mm, washed and then enclosed in dialytic tubes with 3 ml of the aqueous solution of lysozyme. The pHs of the standard buffer solutions of the external liquids were set at 9.01 at 25° C.

Figure 36:
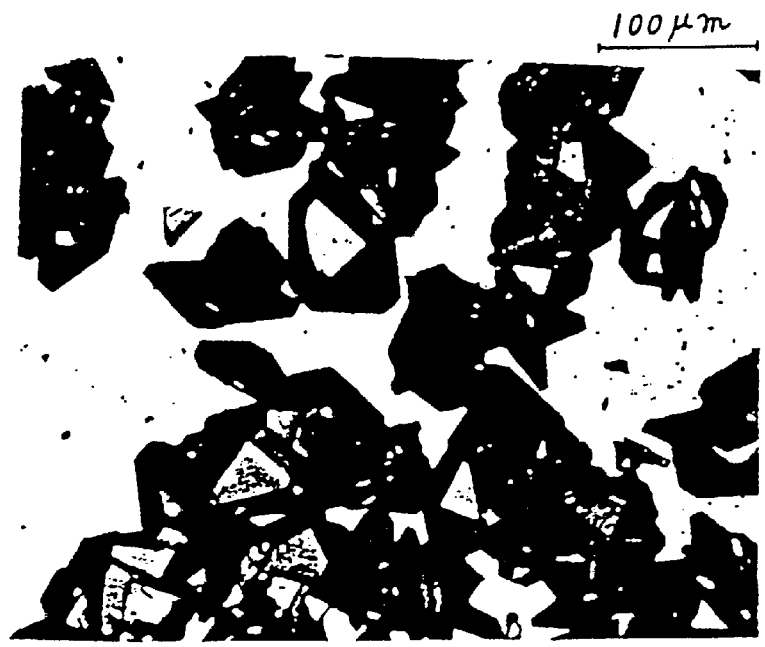
FIGS. 36 and 37 are microphotographs of crystal structures formed in Example 4.
Figure 37:
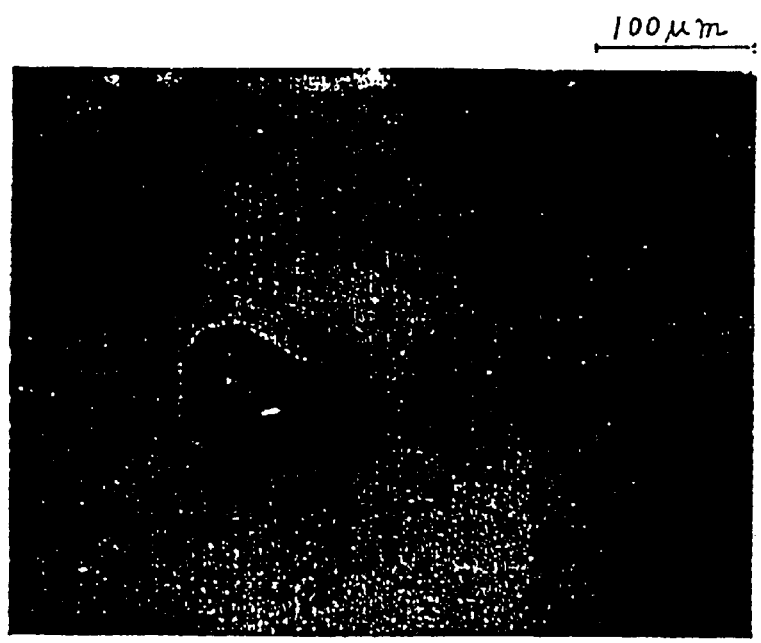

FIG. 36 and FIG. 37 show the resulting crystals of lysozyme grown on the silicons after keeping in a cool dark place of 10° C. for 50 hours. FIG. 36 and FIG. 37 correspond to that employing sample-1 and that employing sample-2 respectively.

(1) Sample-1

While single crystals are present among the crystals of lysozyme depositing on the wafer surface, twin crystals are also considerably great in number. This is conceivably because heterogenous nucleation took place by convection of the electrolytic solution in the aqueous solution.

(2) Sample-2

Lysozyme single crystals of about 0.1 mm in size deposit. In this case, no twin crystals were present, and hence it is inferred that crystallization progressed excellently.

As to the above, crystal growth is superior in sample-2 as compared with sample-1, and it indicates that crystal formation is controllable by the formation of grooves.

The results shown in the aforementioned Example reveal that it is possible to control crystallization of biopolymers on the semiconductor crystal surfaces which have the valence electrons controlled.

Example 5

The hen egg white lysozyme employed in Example 1 was dissolved in a standard buffer solution of pH=9.1 in a concentration of 50 mg/ml, and 3 ml thereof was enclosed in a sufficiently boiled/washed dialytic tube along with a silicon crystal. As such a silicon crystal, the following two types were employed respectively:

(1) Sample of Low Impurity Concentration (High-Resistance) n-type Silicon (Sample-1).

An n-type silicon substrate having a specific resistance of about 20 Ωcm.

(2) Sample of n-type Silicon Having Intermixed Low Impurity Concentration and High Impurity Concentration (High-Resistance and Low-Resistance) Regions (Sample-2).

An n-type silicon substrate wherein the regions of 2 mm square are alternately rendered high-resistive (about 20 Ωcm) and low-resistive (about 0.1 Ωcm). The low-resistive region was prepared on a high-resistive n-type substrate by ion implantation of phosphorus atoms in accordance with a conventional method.

The above silicon crystals (1) and (2) were cut into sizes of about 5 by 10 mm, and dipped in dialytic tubes containing lysozyme. Further, these dialytic tubes were dipped in a standard buffer solution (200 ml) of pH=8.9, and kept in a cool dark place of 10° C. The apparatus for the crystal deposition is as shown in FIG. 2, for example.

Figure 38:
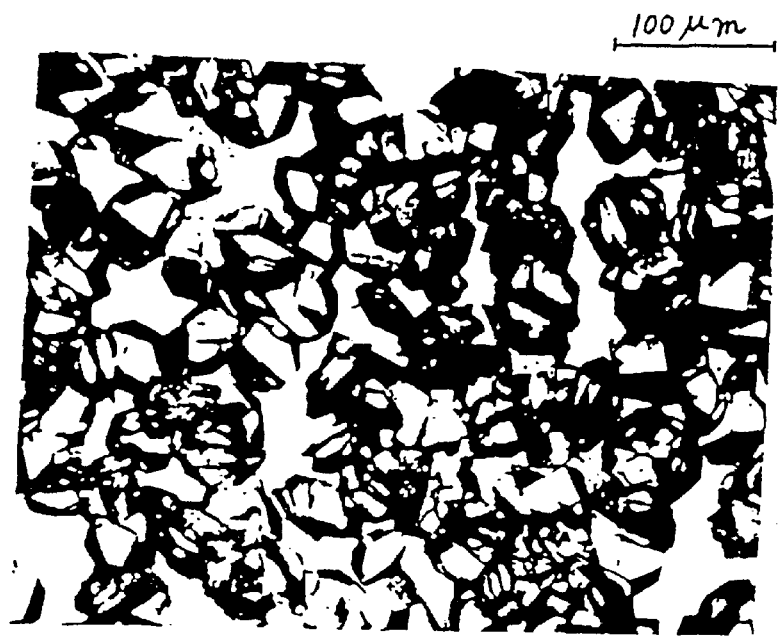
FIGS. 38, 39 and 40 are microphotographs of crystal structures formed in Example 5.
Figure 39:
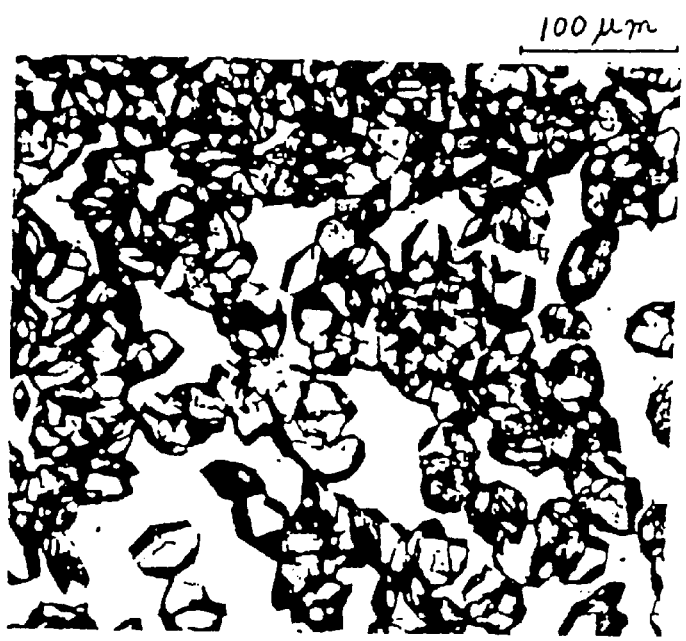
Figure 40:
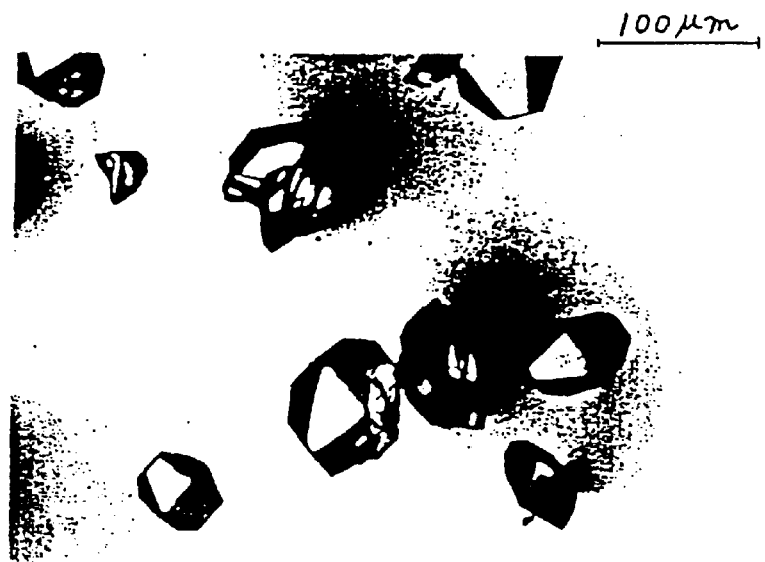

After kept in the cool dark place for 72 hours, the samples were taken out and crystals of lysozyme were observed with a microscope. FIGS. 38 to 40 show results of the above Example. FIG. 38 shows the result of crystallization employing the silicon substrate of the sample-1. FIGS. 39 and 40 show the results obtained by employing the silicon substrate of the sample-2. FIG. 39 shows the result of crystallization in the high-resistive region and FIG. 40 shows the result of crystallization in the low-resistive region respectively. As apparent from the figures, crystals of lysozyme deposit in a large quantity on the overall surface of the silicon substrate in the sample-1. In the sample-2, on the other hand, a large quantity of crystals deposit on the overall surface of the high-resistive region similarly to the sample-1, while crystals only slightly deposit on the low-resistive region.

Example 6

The hen egg white lysozyme employed in Example 1 was dissolved in a standard buffer solution of pH=7.0 in a concentration of 30 mg/ml, and 5 ml thereof was enclosed in a sufficiently boiled/washed dialytic tube along with a silicon crystal. As such a silicon crystal, the following two types were employed respectively:

(1) Sample of Low Impurity Concentration (High-Resistance) n-type Silicon (Sample-1).

An n-type silicon substrate having a specific resistance of about 20 Ωcm.

(2) Sample of n-type Silicon Having Intermixed Low Impurity Concentration and High Impurity Concentration (High-Resistance and Low-Resistance) Regions (Sample-2).

A low-resistive n-type region having a specific resistance of about 1 Ωcm was formed on an n-type high-resistive silicon substrate having a specific resistance of about 20 Ωcm, by the method shown in FIG. 13. As to the high-resistive regions exposed in the low-resistive n-type region surface, the size thereof was 0.05 μm diameter, and the pitch between the regions was 0.5 μm. The high-resistive regions were formed in the low-resistive n-type region along the overall silicon substrate surface. The thickness of the surface low-resistive layer was about 3 μm.

The aforementioned silicon crystals (1) and (2) were cut into sizes of about 5 mm square respectively, and dipped in dialytic tubes containing lysozyme. Further, these dialytic tubes were dipped in the aqueous solution obtained by mixing 200 ml of a standard buffer solution of pH=4.6 and 200 ml of 1M NaCl aqueous solution, and kept in a cool dark place of 10° C.

After kept in the cool dark place for 96 hours, the samples were taken out and crystals of lysozyme were observed with a microscope. Crystals of lysozyme disorderedly deposited in a large quantity on the overall silicon substrate surface in the sample-1. An average size of the depositing crystals was about 0.1 mm. In the sample-2, on the other hand, the quantity of depositing crystals became small, and an average crystal size became about 0.3 mm. It is conceivable that a small quantity of relatively large-sized crystals were formed in the sample 2 because the formation of the crystals was suppressed in the low-resistive region while deposits serving as nuclei of crystals selectively aggregated and assembled on the high-resistive regions and these grew up to the large-sized crystals.

Example 7

The hen egg white lysozyme employed in Example 1 was dissolved in a standard buffer solution of pH 9.18 in a concentration of 30 mg/ml, and 3 ml thereof was enclosed in a sufficiently boiled/washed dialytic tube along with a silicon crystal. As such a silicon crystal, the following two types were employed respectively:

(1) Sample of Low Impurity Concentration (High-Resistance) n-type Silicon (Sample-1).

An n-type silicon substrate having a specific resistance of about 20 $\Omega$cm.

(2) Sample of n-type Silicon Having Intermixed Low Impurity Concentration and High Impurity Concentration (High-Resistance and Low-Resistance) Regions (Sample-2).

This is obtained by forming surface regions of 2 mm square in three types of low resistance values, about 10 $\Omega$cm, about 1 $\Omega$cm and about 0.1 $\Omega$cm sequentially on an n-type silicon substrate having a specific resistance of about 20 $\Omega$cm, as shown in FIG. 14. The low-resistance regions were prepared on the high-resistance n-type substrate respectively by ion implantation of phosphorus atoms. The thickness of the surface low-resistance layer was about 3 $\mu$m.

The aforementioned silicon crystals (1) and (2) were cut into sizes of about 5 by 10 mm respectively, and dipped in dialytic tubes containing lysozyme. Further, these dialytic tubes were dipped in a standard buffer solution (200 ml) of pH 8.9, and kept in a cool dark place of 10° C.

Figure 41:
FIGS. 41, 42 and 43 are microphotographs of crystal structures formed in Example 7.
Figure 42:
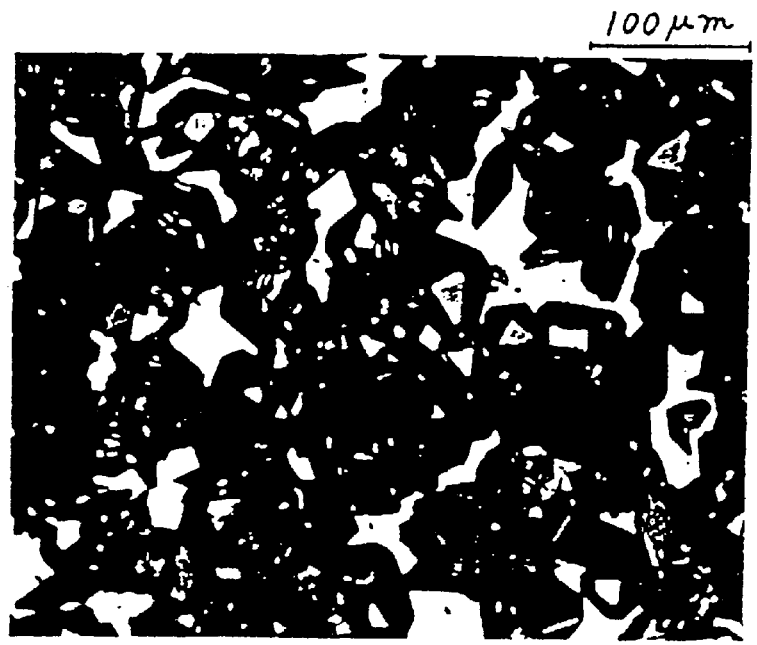
Figure 43:
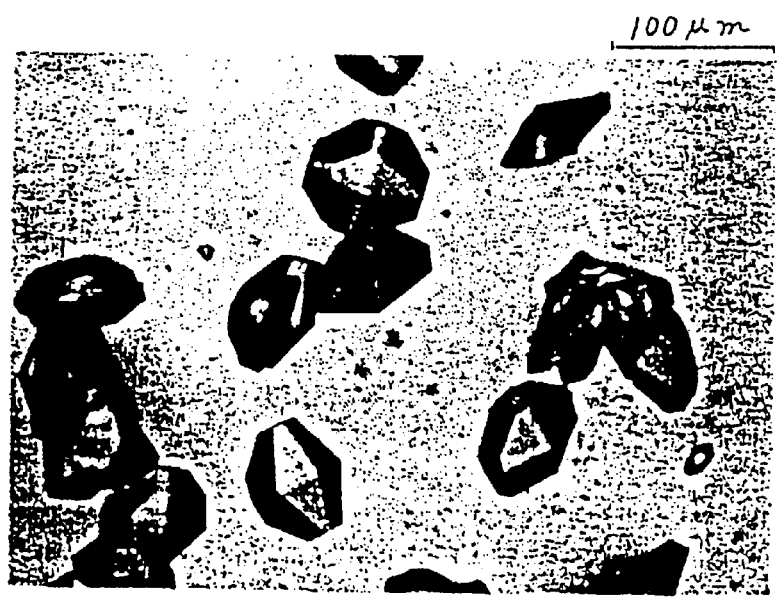
Figure 44:
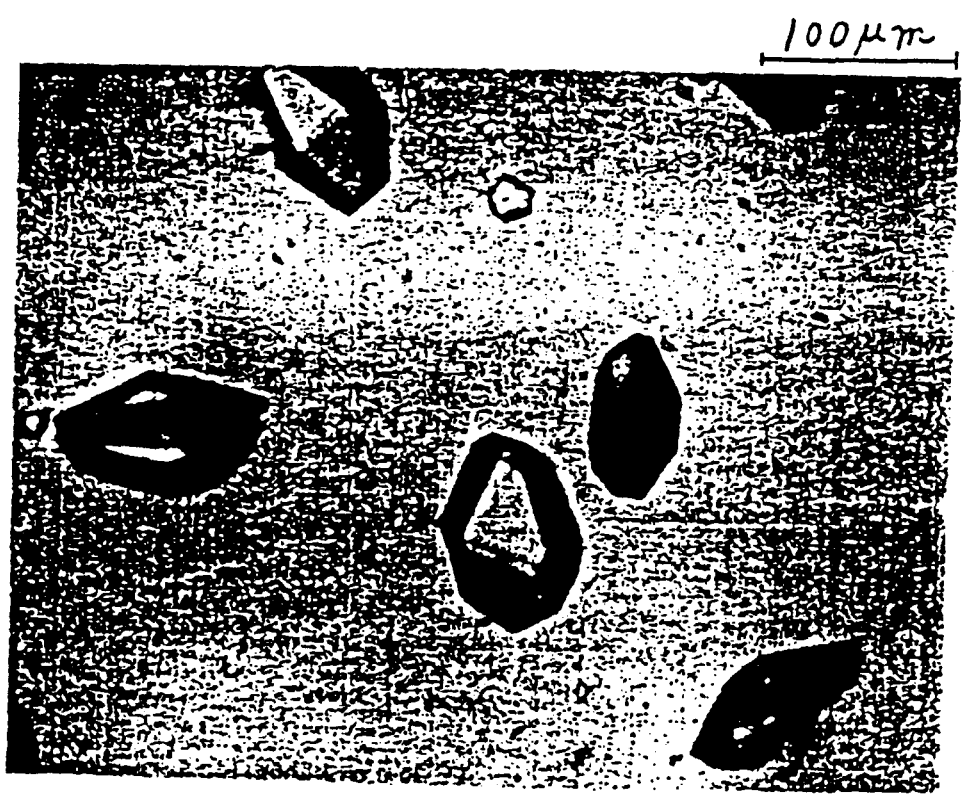
Figure 45:
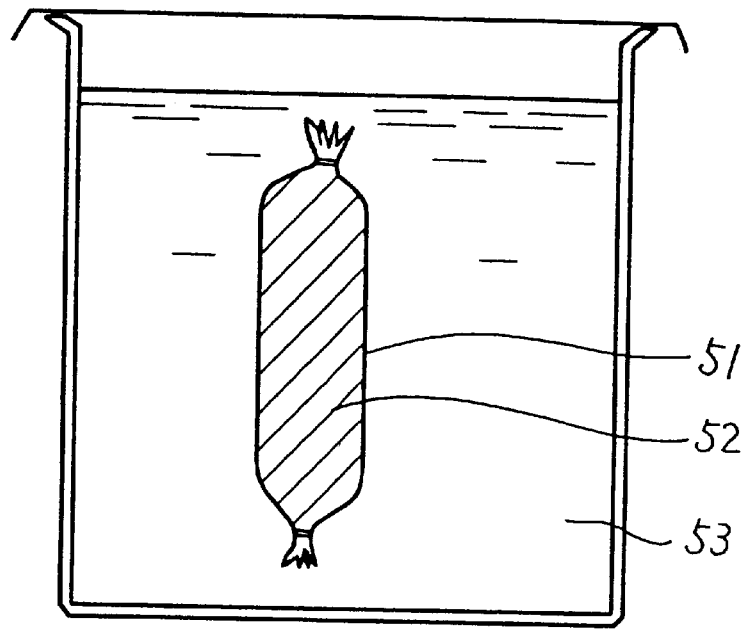
FIG. 45 is a typical diagram showing an example of an apparatus employed for a conventional method.
Figure 46:
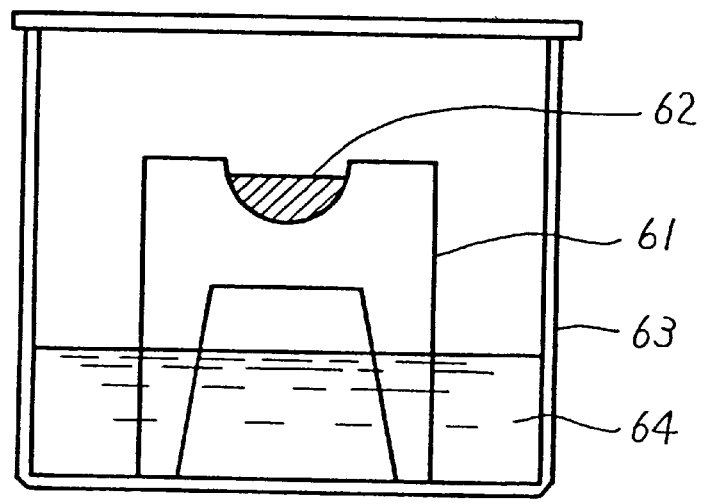
FIG. 46 is a typical diagram showing another example of an apparatus employed for a conventional method.

After kept in the cool dark place for 96 hours, the samples were taken out and crystals of lysozyme were observed with a microscope. FIGS. 41 to 44 show results of the aforementioned Example. FIG. 41 shows the result of crystallization employing the silicon substrate of the sample-1. FIGS. 42 to 44 show the results obtained by employing the silicon substrate of the sample 2, and FIG. 42 shows the result in the region having the specific resistance of about 10 $\Omega$cm, FIG. 43 shows the result in the region having the specific resistance of about 1 $\Omega$cm, and FIG. 44 shows the result in the region having the specific resistance of about 0.1 $\Omega$cm respectively. As apparent from the figures, in the sample-1, crystals of lysozyme deposit on the overall surface of the silicon the substrate in a large quantity. In the sample-2, on the other hand, a large quantity of crystals deposit on the overall surface of the high-resistance region similarly to the sample-1, while the quantity of depositing crystals reduces and the sizes of the crystals increase as the regions have lower resistance.

Thus, it is apparent that the formation of crystals is controllable by the valence electron control of a silicon substrate, in this case, by doping prescribed positions of a high-resistance n-type substrate with an impurity to prepare low-resistance regions.

Industrial Availability

According to the present invention, as hereinabove described, it is possible to overcome the disadvantages of the conventional crystallization process which has been progressed while repeating trial and error since there has been no technique applicable to any substance due to provision of various properties. The present invention can provide more suitable conditions for crystallization of biopolymers such as protein which are particularly hard to crystallize. It is conceivable that, according to the present invention, conditions of crystallization can be provided for proteins such as membrane proteins having a hydrophobic region and a hydrophilic region, which have heretofore been hard to crystallize, in particular. The present invention can provide conditions for readily forming a seed crystal serving as a nucleus of a crystal, for example. The obtained seed crystal can be transferred under better conditions, in order to form a larger crystal. On the other hand, it is possible to stabilize nucleation in an initial process of crystallization, for suppressing and controlling mass formation of crystallites, according to the present invention. In this case, a larger crystal can be formed by suppressing the formation of crystallites.

The present invention is applied to research, development and production of useful substances, particularly biopolymers such as proteins, nucleic acids and the like, in pharmaceutical industry, food industry and the like. According to the present invention, it is possible to grow a crystal having excellent crystallinity enabling X-ray structural analysis. Information obtained as to the molecular structure and the mechanism of activity as a result of crystal analysis is applied to design and preparation of medicine. Further, the present invention is applied to purification or crystallization of molecules of interest. In addition, the application is expected for the preparation of an electronic device employing biopolymers such as proteins in relation to the present invention.

The embodiments disclosed this time must be considered as illustrative and not restrictive in all points. The scope of the present invention is shown not by the above description but by claims, and it is intended that all changes in the meaning and range equal to claims are included.

What is claimed is:

1. A solid crystallization control component for preparing a crystal of an organic compound, said component comprising:

a semiconductor substrate in which the concentration of holes or electrons present at a surface thereof has been modified to generate a surface potential for controlling crystallization of an organic compound in a solution, wherein the modified concentration of the holes or electrons is generated by doping an impurity into the semiconductor substrate, and wherein the surface of the semiconductor substrate has at least a first region and a second region, and the concentration of the impurity varies continuously in the portion between the first region and the second region.

2. A solid crystallization control component for preparing a crystal of an organic compound, said component comprising:

a semiconductor substrate in which the concentration of holes or electrons present at a surface thereof has been modified to generate a surface potential for controlling crystallization of an organic compound in a solution, wherein the modified concentration of the holes or electrons is generated by doping an impurity into the semiconductor substrate, and wherein the surface of the semiconductor substrate has at least a first region and a second region, and the concentration of the impurity varies stepwise in the portion between the first region and the second region.

3. A solid crystallization control component for preparing a crystal of an organic compound, said component comprising:

a semiconductor substrate in which the concentration of holes or electrons present at a surface thereof has been modified to generate a surface potential for controlling crystallization of an organic compound in a solution, wherein the modified concentration of the holes or electrons is generated by doping an impurity into the semiconductor substrate, and wherein the surface of the semiconductor substrate has at least a first region and a second region having different impurity concentrations and/or different impurity species, so that the first and second regions differ in the concentration of the holes or electrons, and the crystal growth is suppressed on the first region and facilitated on the second region, wherein the first region is larger than the second region, and the second region is surrounded by the first region.

4. A solid crystallization control component for preparing a crystal of an organic compound, said component comprising:

a semiconductor substrate in which the concentration of holes or electrons present at a surface thereof has been modified to generate a surface potential for controlling crystallization of an organic compound in a solution, wherein the modified concentration of the holes or electrons is generated by doping an impurity into the semiconductor substrate, and wherein the surface of the semiconductor substrate has at least a first region and a second region having different impurity concentrations and/or different impurity species, so that the first and second regions differ in the concentration of the holes or electrons, and the crystal growth is suppressed on the first region and facilitated on the second region, wherein the first region is a major part of the surface, and the second region is a minor part of the surface, and a plurality of the second regions are separately arranged in the first region in a matrix formation.

5. A solid crystallization control component for preparing a crystal of an organic compound, said component comprising:

a semiconductor substrate in which the concentration of holes or electrons present at a surface thereof has been modified to generate a surface potential for controlling crystallization of an organic compound in a solution, wherein the modified concentration of holes or electrons is generated by doping an impurity into the semiconductor substrate, and wherein the surface of the semiconductor substrate has at least a first region and a second region having different impurity concentrations and/or different impurity species, so that the first and second regions differ in the concentration of the holes or electrons, and the crystal growth is suppressed on the first region and facilitated on the second region, wherein the semiconductor substrate has a groove, and the first region is outside of the groove and the second region is inside of the groove.

* * * * *